United States Patent
Khanna

(10) Patent No.: US 7,114,026 B1
(45) Date of Patent: Sep. 26, 2006

(54) CAM DEVICE HAVING MULTIPLE INDEX GENERATORS

(76) Inventor: Sandeep Khanna, 2311 Regina Ct., Santa Clara, CA (US) 95054

( * ) Notice: Subject to any disclaimer, the term of this patent is extended or adjusted under 35 U.S.C. 154(b) by 876 days.

(21) Appl. No.: 10/174,325

(22) Filed: Jun. 17, 2002

(51) Int. Cl.
 *G06F 12/00* (2006.01)
(52) U.S. Cl. ......................................... 711/108; 365/49
(58) Field of Classification Search ................ 711/108, 711/128, 158; 703/16; 365/49, 139, 189; 370/392, 401; 709/249
 See application file for complete search history.

(56) References Cited

U.S. PATENT DOCUMENTS

| | | | |
|---|---|---|---|
| 3,648,254 A | | 3/1972 | Beausoleil |
| 3,890,603 A | * | 6/1975 | Jones et al. ................... 365/49 |
| 4,845,668 A | | 7/1989 | Sano et al. |
| 4,958,377 A | | 9/1990 | Takahashi |
| 4,996,666 A | | 2/1991 | Duluk, Jr. |
| 5,226,009 A | * | 7/1993 | Arimoto ................ 365/189.04 |
| 5,319,762 A | | 6/1994 | Mayer |
| 5,414,704 A | | 5/1995 | Spinney |
| 5,555,397 A | * | 9/1996 | Sasama et al. .............. 711/158 |
| 5,642,322 A | | 6/1997 | Yoneda |
| 5,860,085 A | | 1/1999 | Stormon et al. |
| 5,870,324 A | | 2/1999 | Helwig et al. |
| 5,956,336 A | | 9/1999 | Loschke et al. |
| 5,978,885 A | | 11/1999 | Clark, II |
| 6,041,389 A | | 3/2000 | Rao |
| 6,069,573 A | | 5/2000 | Clark, II et al. |
| 6,070,223 A | * | 5/2000 | Yoshizawa et al. ......... 711/108 |
| 6,081,440 A | | 6/2000 | Washburn et al. |
| 6,081,442 A | | 6/2000 | Igarashi et al. |
| 6,098,147 A | | 8/2000 | Mizuhara |
| 6,161,144 A | | 12/2000 | Michels et al. |
| 6,226,710 B1 | | 5/2001 | Melchior |
| 6,236,658 B1 | * | 5/2001 | Essbaum et al. ............. 370/401 |
| 6,324,087 B1 | * | 11/2001 | Pereira ........................ 365/49 |
| 6,374,326 B1 | | 4/2002 | Kansal et al. |
| 6,467,020 B1 | * | 10/2002 | Stilkol et al. ................ 711/108 |
| 6,529,633 B1 | | 3/2003 | Easwar et al. |
| 6,553,453 B1 | * | 4/2003 | Gibson et al. .............. 711/108 |
| 6,567,559 B1 | | 5/2003 | Easwar |
| 6,574,701 B1 | * | 6/2003 | Krishna et al. ............. 711/108 |
| 6,639,819 B1 | * | 10/2003 | Uzawa et al. ................. 365/49 |
| 6,779,043 B1 | * | 8/2004 | Crinion ....................... 709/249 |
| 2001/0028651 A1 | * | 10/2001 | Murase ....................... 370/392 |
| 2002/0118419 A1 | * | 8/2002 | Zheng et al. ................ 359/139 |
| 2004/0199724 A1 | * | 10/2004 | Jalowiecki et al. ......... 711/128 |
| 2005/0228629 A1 | * | 10/2005 | Dalton ......................... 703/16 |

OTHER PUBLICATIONS

Jon P. Wade, Charles G. Sodini, "A Ternary Content Addressable Search Engine", Aug. 1989, Ieee Jornal of Solid-State Circuits, IEEE.*

(Continued)

*Primary Examiner*—Pierre Bataille
*Assistant Examiner*—Paul Schlie
(74) *Attorney, Agent, or Firm*—Shemwell Mahamedi LLP

(57) ABSTRACT

A content addressable memory (CAM) device having multiple index generators is described. Each of the index generators is coupled to at least one of a plurality CAM blocks. Each of the plurality of CAM blocks includes a CAM block array and a priority encoder. Each of the index generators includes a priority encoder and match enable circuits. Each index generators is configured to receive a block index and a block match flag from a corresponding CAM block and generate a device index corresponding to a highest priority matching entry in a respective CAM block or a group of associated CAM blocks participating in a compare operation.

45 Claims, 17 Drawing Sheets

OTHER PUBLICATIONS

Anthony J. McAuley, Paul Francis, "Fast Ruting Table Lookup CAMs", 1993, IEEE.*

Teuvo Kohonen, "Content-Addressable Memories" 1987 second edition, Springer-Verlag, pp. 128-129, 142-144.*

International Search Report, International Application No. PCT/US03/18740, Jun. 11, 3002.

* cited by examiner

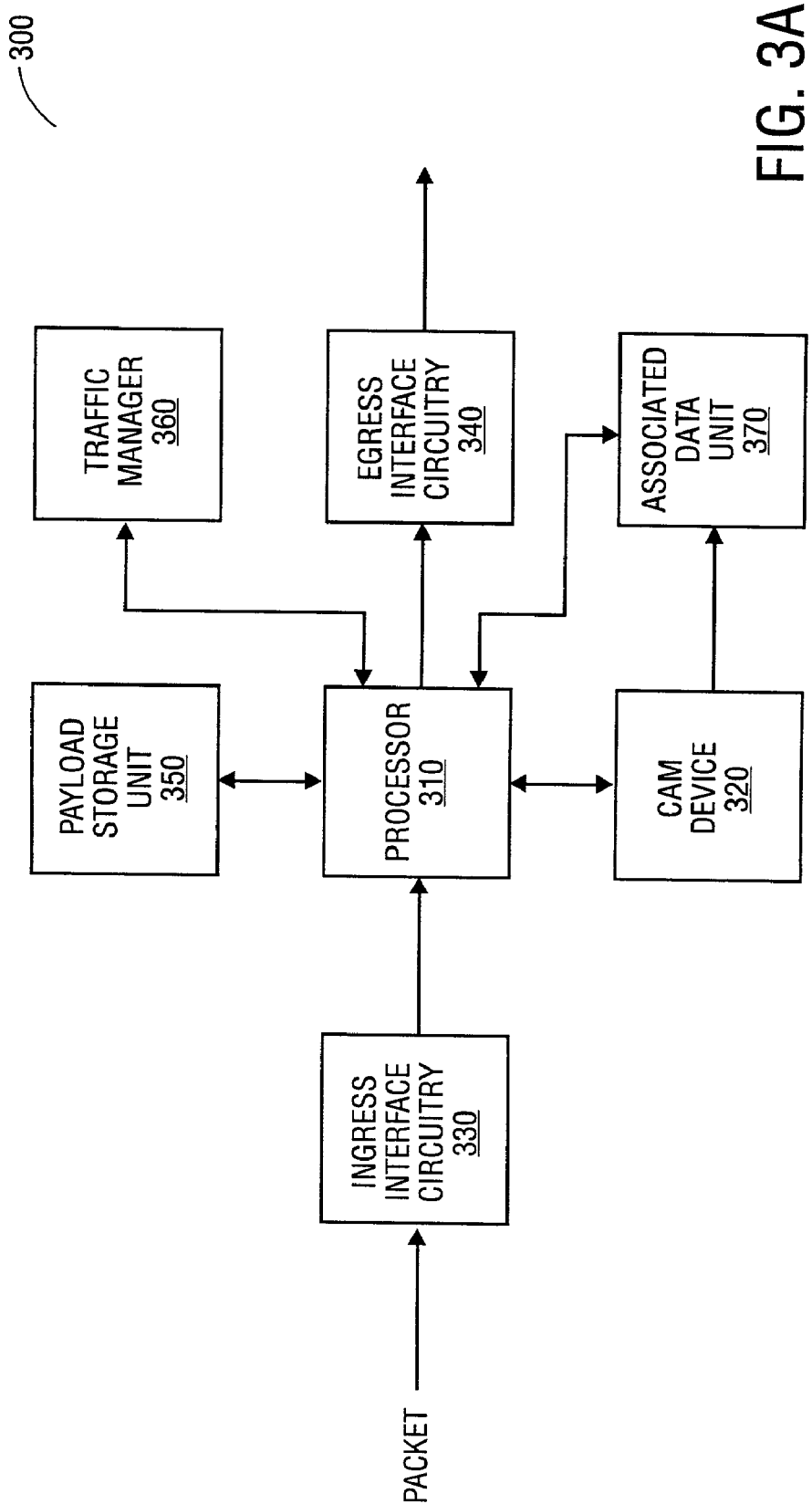

US 7,114,026 B1

CAM DEVICE HAVING MULTIPLE INDEX GENERATORS

FIELD OF THE INVENTION

This invention relates to the field of memory devices and, in particular, to content addressable memory devices.

BACKGROUND OF THE INVENTION

Networks contain a collection of computing systems (e.g., clients and servers) that are interconnected by transmission lines to enable the transfer of data between them. A network typically includes multiple access points (e.g., routers and servers) that may switch and/or route data between transmission lines to transfer data from a source to a destination. Data is typically transmitted in the form of packets that are made up of smaller data cells. A packet is a unit of data that is routed between a source and a destination on a packet-switched network. When a file (e.g., e-mail, graphics, etc.) is sent from one place to another on a network, the file is divided into such smaller packets making them more efficient for transmission. The individual packets for a given file may travel different routes throughout networks with each packet containing both data and transmission information associated with the routing of data. As such, a packet may be described as having a payload containing the data, and one or more headers that contain the routing information (e.g., a destination address).

When all the packets have arrived at a destination, they are reassembled into the original file at the receiving end. Such a packet switching scheme is an efficient way to handle transmission on a connectionless network. This is in contrast to a circuit switching scheme where a connection (e.g., a voice connection) requires the dedication of a particular path for the duration of the connection.

A router is a device (e.g., hardware, firmware, software) that determines the next network segment to which a packet should be forwarded towards its destination. A router may be positioned at points within a network or where one network meets another, referred to as a gateway. A router may create and maintain tables of the available routes and their conditions for use with other information to determine the best route for a given packet. Typically, a packet may travel through a number of network points having routers before arriving at its destination.

When a data packet arrives at the input of a router, several lookups may be performed to determine the subsequent handling of the packet, as illustrated in FIG. 1. The lookups may include, for examples, where to send the packet next (Next Hop), the quality of service requirement (QoS), the Ethernet port address, etc. Consider, for example, a packet arriving at Router-A. Router-A needs to determine whether the packet is destined for local servers connected directly to Router-A, or if the packet should go to the next router on a route (Router-B) to a destination. Additionally, Router-A may assign a priority based on the destination address (DA) and the source address (SA) of the packet.

The packet header may first be parsed or processed to get the values from different fields (e.g., SA, DA, protocol type, QoS, etc) in order to perform the various lookups. A packet classification lookup, for example, may be performed using SA, DA and other relevant fields in the packet header. The Next Hop lookup, for example, may also be performed to determine whether the packet is meant for local servers or for Router-B. If the packet is destined for Router-B, the packet is then put in a queue for Router-B. If the packet is destined for a local server (e.g., Server-1 or Server-2), then a media access control (MAC) lookup is performed to send the packet to the appropriate server. In the preceding example, three lookups are necessary for sending the packet on its way: Packet Classification, Next Hop, and MAC. However, often there are other lookups performed on the packet header.

Routers may use processors and content addressable memory (CAM) devices to perform the various lookups on packets. As opposed to a random access memory (RAM) device, in which information is accessed by specifying a particular memory location address, the data stored in a CAM is accessed by the contents of the data. More specifically, instead of using an address to access a particular memory location, a CAM uses a key that contains a portion of the desired contents of a particular memory cell in the memory device. The CAM can be instructed by a processor to compare the key, also referred to as a comparand (e.g., packet header data) with data stored in its associative memory array, as illustrated in FIG. 2. The CAM simultaneously examines all of its entries and selects the stored data that matches the key.

When the entire CAM device, or blocks thereof, is searched simultaneously for a match of the stored data with the key/comparand, the CAM device indicates the existence of a match by asserting a match flag. Multiple matches may also be indicated by asserting a multiple match flag. The CAM device typically includes a priority encoder to translate the matched location into a match address or CAM index. The priority encoder may also sort out which matching memory location has the top priority if there is more than one matching entry.

Data may be represented in the form of strings of binary digits ("bits") having a low ("0") logic state and a high ("1") logic state. Different types of CAMs may be used with different data formats. A binary CAM is designed to operate with "0" and "1" states, while a ternary CAM is designed to operate with "0", "1", and "don't care" states. The bits may be organized into groups such as a word (e.g., 64 or 72 bits wide) and stored in different segments of a CAM. The keys used for different data fields may have different word sizes, for example, the key for a Classification lookup may be 128 bits wide and the key for a Next Hop lookup may be 32 bits wide.

A router may include multiple CAMs, with each CAM having a different table or, alternatively, a single CAM having multiple block arrays for each of the different tables, for performing the different lookups. For example, a router may include a 32 bit wide Next Hop CAM, a 128 bit Classification CAM, and a 48 bit MAC CAM.

Each of the multiple CAMs, or CAM block arrays, are typically connected to common buses that are used to communicate the various search keys, indices, and other input and output data with each of the CAMs, or CAM block arrays. Thus, lookups are typically performed sequentially before a packet is processed (e.g., routed to the next destination or classified). Because the buses are shared with so many input and output functions of all the CAMs or CAM block arrays, many clock cycles are required to multiplex data on the bus. This generally limits the search rate and overall throughput of conventional CAM devices.

In some prior multiple block CAM devices, all of the block arrays typically participate in a given lookup. This can cause an undesirable amount of power to be drawn during the lookup. Other prior multiple block CAM devices use class codes and search codes to perform searches of different types on one or more of the array blocks. For example, different lookup tables may be formed spanning one or more of the array blocks. The array blocks associated with each lookup table are given a unique class code that identifies information stored in the table such as table configuration (i.e., width and depth) and type of data stored in the table (e.g., IP, MPLS, MAC lookup, etc.). A search code is typically provided with the search key in order to identify a particular table to be searched that has an associated class code matching the search code. However, the lookups in such prior CAM devices are performed using only a single search code at any given time. In other words, a search code is provided to the CAM device and only a table having a class code that matches the search code is searched. Therefore, lookups in tables having different class codes, based on different search codes, are performed sequentially before a packet is processed, thereby increasing device throughput.

As the number of ports, segments, or devices that are supported by routers increase and as the number of lookups increase, conventional CAM devices and architectures can undesirably limit the system's overall throughput and power consumption.

Some CAM devices store data in a preordered or prioritized manner such that higher priority data may be stored in lower logical addresses of the CAM array than lower priority data. Particular route data has a higher priority than other route data when such route data is to be selected over the other route data even though both route data may match a search key. The prioritizing of route data is typically performed by table management hardware and/or software that adds overhead to the router. If the table is not prioritized correctly, then an incorrect route may be selected for an incoming packet. When data stored in a CAM array is changed by adding new route data that has a higher (or equal) priority than data already stored in the CAM array, the table management hardware and software needs to reprioritize or reorder all or part of the CAM array. This is typically accomplished by reloading the CAM array with a new prioritized group of data. This can add significant overhead to the router (e.g., delay and additional hardware and software) to change a single route data stored in the CAM array.

BRIEF DESCRIPTION OF THE DRAWINGS

The present invention is illustrated by way of example and not intended to be limited by the figures of the accompanying drawings.

FIG. 3A illustrates one embodiment of a line card or blade of a router having a CAM device configured according to the present invention.

DETAILED DESCRIPTION

Figure 1:
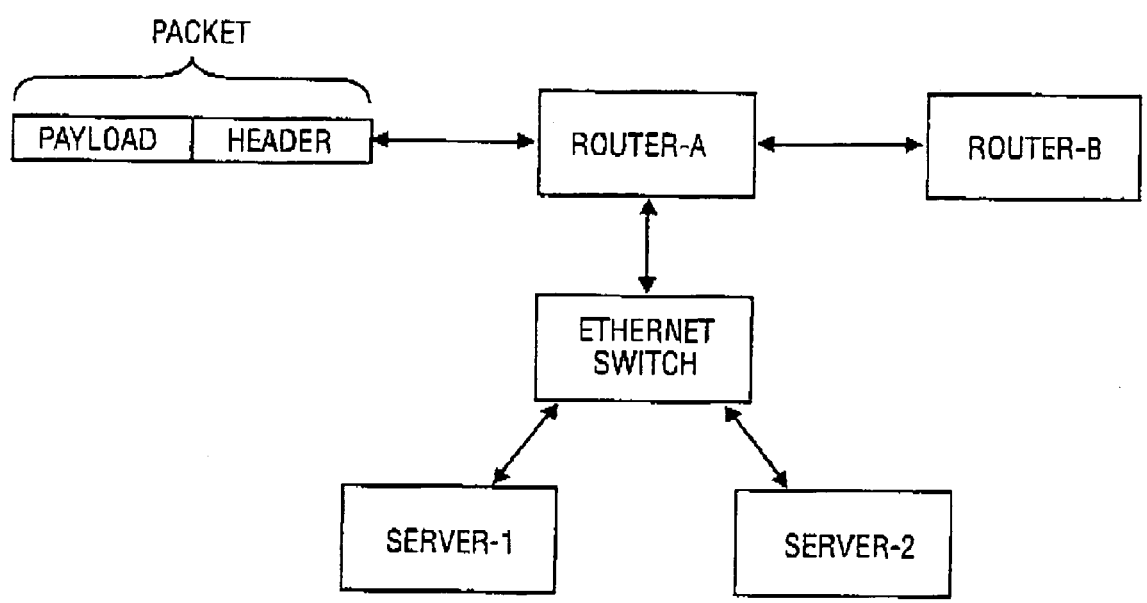
FIG. 1 is a conceptual illustration of packet handling by a router.
Figure 2:
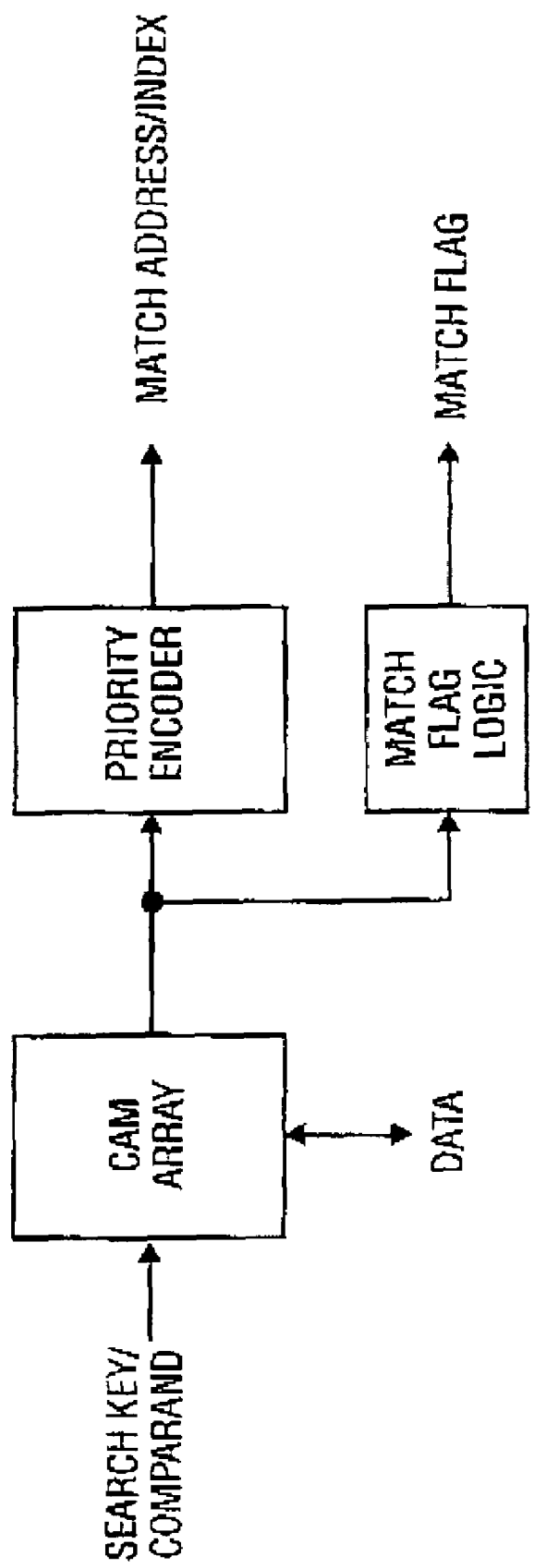
FIG. 2 illustrates one embodiment of a conventional CAM device.

In the following description, numerous specific details are set forth such as examples of specific, components, circuits, processes, etc. in order to provide a thorough understanding of the present invention. It will be apparent, however, to one skilled in the art that these specific details need not be employed to practice the present invention. In other instances, well known components or methods have not been described in detail in order to avoid unnecessarily obscuring the present invention.

Embodiments of the present invention include various method steps, which will be described below. The steps may be performed by hardware components or may be embodied in machine-executable instructions, which may be used to cause hardware components (e.g., a processor, programming circuit) programmed with the instructions to perform the steps. Alternatively, the steps may be performed by a combination of hardware and software.

Embodiments of the present invention may be provided as a computer program product, or software, that may include a machine-readable medium having stored thereon instructions. The machine readable medium may be used to program a computer system (or other electronic devices) to generate articles (e.g., wafer masks) used to manufacture embodiments of the present invention. The machine-readable medium may include, but is not limited to, floppy diskettes, optical disks, CD-ROMs, and magneto-optical disks, ROMs, RAMs, EPROMs, EEPROMs, magnet or optical cards, flash memory, or other type of media/machine-readable medium suitable for storing electronic instructions.

The machine readable medium may store data representing an integrated circuit design layout that includes embodiments of the present invention. The design layout for the integrated circuit die may be generated using various means, for examples, schematics, text files, gate-level netlists, hardware description languages, layout files, etc. The design layout may be converted into mask layers for fabrication of wafers containing one or more integrated circuit dies. The integrated circuit dies may then be assembled into packaged components. Design layout, mask layer generation, and the fabrication and packaging of integrated circuit dies are known in the art; accordingly, a detailed discussion is not provided.

It should be noted that while at times reference may be made to "bytes," such reference is only exemplary for ease of discussion and, unless otherwise stated, is not meant to limit the invention. As such, the methods and apparatus discussed herein may be implemented with one or more bits or bit groups (with each bit group containing one or more bits). In addition, the steps and operations discussed herein (e.g., the loading of registers) may be performed either synchronously or asynchronously. The term "coupled" as used herein means connected directly to or connected through one or more intervening components or circuits. Any of the signals provided over various buses described herein may be time multiplexed with other signals and provided over one or more common buses.

A CAM device having a plurality of CAM blocks and a plurality of index generators is described. Each of the plurality of CAM blocks includes a priority encoder. In one embodiment, each of the plurality of index generators may be coupled to each of the plurality of CAM blocks. Each of the plurality of index generators includes a priority encoder. The CAM device may also include match enable circuits configured to receive block match flags from the plurality of CAM blocks and output qualified block match flags to the priority encoders in the index generators. In one embodiment, match enable circuits may also output qualified block match flags to device flag logic circuits.

One or more compare operations may be performed in different CAM blocks. In one embodiment, different device indices may be concurrently generated by the index generators for one or more of the block compare operations. A search code corresponding to a particular compare operation is compared with a class code associated with each CAM block to enable a relevant block to perform a compare operation. In one embodiment, each CAM block has a unique class code associate with it and, thereby, may perform its own different compare operation. Alternatively, multiple CAM blocks may be assigned the same class code. Where different CAM blocks are performing different compare operations, the index generators may concurrently output the results from each of the block compare operations. The results from each of the index generators are provided as the address of the highest matching entry for a corresponding block.

Where different CAM blocks are performing portions of one compare operation (i.e., the different CAM blocks are assigned the same class code), the results from each of the CAM blocks may be combined by an index generator to provide the address of the highest priority matching entry among all of the participating CAM blocks as the device index for that compare operation. For example, if there is a first match condition in a first CAM block and a second match condition in a second CAM block, the index generator outputs the block index of the matching entry having the highest priority among the first and second matching conditions, where it is concatenated with its corresponding block index to generate the device index associated with the highest priority matching CAM block.

In one embodiment, data stored in a CAM block array has associated with it a priority number that indicates the priority of the data relative to other data in the array. In such an embodiment, the CAM block may include a programmable priority encoder that includes a priority index table that stores the priority numbers. The priority index table determines the most significant priority number from among the data that match a comparand for a compare operation. The most significant priority number may be the priority number with the lowest or highest numerical value. The most significant, or highest priority number, is provided to the index generators. The index generator, in this embodiment, includes compare logic that compares the highest priority numbers from each of the CAM blocks for all qualified match flags that indicate a match and outputs the highest of the highest priority numbers.

Such an embodiment obviates the need to preloading data in a predetermined order. Instead, the programmable priority encoder determines the most significant priority number from among matching entries regardless of the order in which data is stored in the table. This can reduce the hardware and/or software needed for table management and can increase the performance of a router. In addition, new data can be added at any location in the CAM array and associated priority numbers loaded into corresponding locations of the priority index table. If new data has a priority greater that is greater than or equal to a priority of already stored data, the priority number of the previously stored data may be updated to accommodate the new data. Similarly, when data is removed (i.e., invalidated or overwritten), the priority numbers of the previously stored lower priority data may be updated. The updating function may be performed by priority logic in the priority index table. The updating function can be performed without the need to physically reorder the data or priority numbers in the priority index table.

FIG. 3A illustrates one embodiment of a line card or blade of a router having a CAM device configured to perform concurrent lookups. Line card 300 includes processor 310, ingress interface circuitry 330, egress interface circuitry 340, CAM device 320, associated data storage unit 370, traffic manager 360, and payload storage unit 350.

Processor 310 functions to control the overall operation of line card 300 in cooperation with the other components of line card 300. For example, processor 310 receives packets from a network medium through ingress interface circuitry 330, stores the payload of packets in payload storage unit 350, and processes packet header information to determine required lookups in CAM device 320 and subsequent handling of the packets, as discussed herein. Ingress circuitry includes, for example, PHY and MAC devices. Processor 310 sends out packets on a network medium through egress interface circuitry 340 based on the lookups performed by CAM device 320. Egress interface circuitry 340 may be connected to a switch fabric or directly to one or more other routers or switches. Processor 310 may be one or more network processor units (NPUs), microprocessors, or one or more special purpose processors such as a digital signal processor (DSP). In another embodiment, processor 310 may be another type of controller, for example, a field programmable gate array or a general purpose processor. The processor 310, ingress interface circuitry 330, and egress interface circuitry 340 components are known in the art; accordingly, a detailed discussion is not provided.

In response to information in a packet header, for a particular packet, processor 310 determines the number and types of lookups to be performed by one or more of CAM devices 320, and forms the search keys for these lookups. The searches or lookups may include, for example, Classification lookups, forwarding lookups (e.g., Next Hop or longest prefix match (LPM) lookup, MAC lookup, MPLS lookup, etc.). When multiple searches are required, processor 310 forms a composite search key that includes at least two, and as many as all, of the various search keys for the lookups. The composite search key is provided as a common input to CAM device 320. CAM device 320 selectively identifies and extracts the individual search keys from the common input and provides the individual search keys to an associated CAM array or block to perform a lookup. A CAM array block may be an entire array, sub-array, or a portion of an array or sub-array. Where CAM device 320 includes multiple arrays, blocks, or block segments, as discussed below, different lookups can then occur concurrently (or simultaneously) in CAM device 320, thereby increasing overall throughput over conventional systems in which searches are processed sequentially.

CAM device 320 includes filter circuits (e.g., a cross-bar switch) to generate search keys from the common input that are provided to the associated CAM array to perform the lookups. The search results from each lookup may be provided, for example, simultaneously or sequentially to processor 360 or directly to associated data unit 370. After the one or more lookups are executed in CAM device 320, associated information for matching entries (e.g., additional routing information and/or packet information) may be retrieved from associated data unit 370. Processor 310 then communicates with traffic manager 360 to schedule the exit of a packet from line card 300 via egress interface circuitry 340.

Figure 3B:
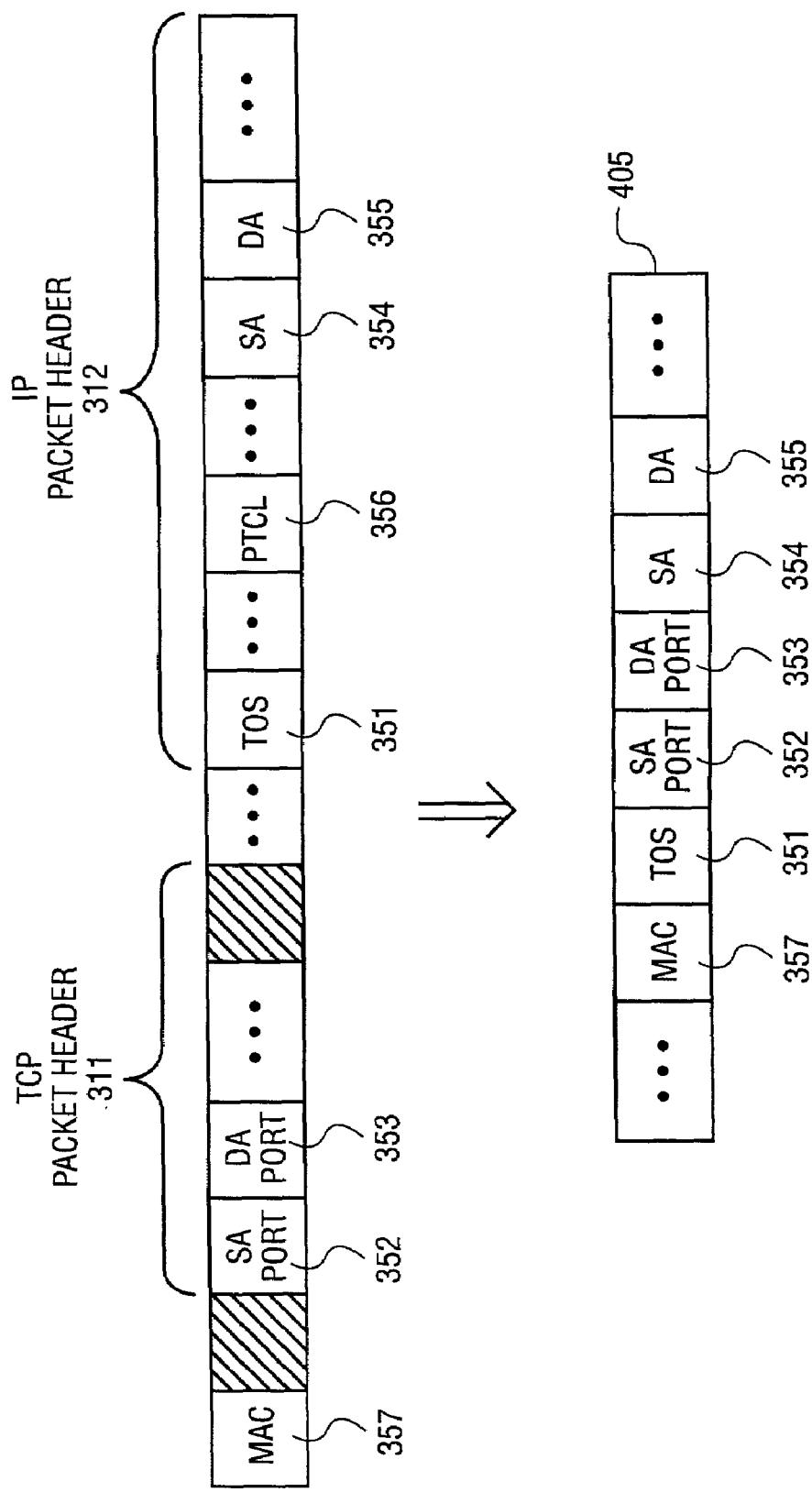
FIG. 3B illustrates one embodiment of input data.

FIG. 3B illustrates one embodiment of input data. In this embodiment, input data 405 may include field segments parsed or processed from one or more packet headers 311 and 312. When data processing systems (e.g., routers, clients, servers) exchange data over a network, the procedure involves the use of protocols by which these systems agree on how to communicate with each other. To reduce design complexity, networks may be organized as a series of layers. The number of layers and the function of each layer varies from network to network.

For example, where a transmission control protocol (TCP)/Internet protocol (IP) is used, it is organized into multiple layers including a network access layer and an Internet layer. The network access layer uses a TCP to enable the exchange of data between an end system and a network. An Internet layer uses an IP to enable data to traverse multiple interconnected networks. Each of these protocols uses packet headers containing routing information, as discussed above. For example, TCP packet header 311 includes a source address (SA) port segment 352 and a destination address (DA) port segment 353, and IP packet header 312 includes a SA segment 354, a DA segment 355, a type of service (ToS) segment 351, and a protocol type segment 356.

In one embodiment, for example, processor 310 of FIG. 3A may be used to parse certain segments from packet headers 311 and 312 to generate input data 405 and transmit the input data to CAM device 320. For example, input data 405 may include MAC segment 357, TOS segment 351, SA port segment 352, DA port segment 353, SA segment 354, and DA segment 355. Alternatively, input data 405 may include more or less than the segments illustrated. One or more bits or group of bits (e.g., bytes) of different field segments of input data 405 may be translated to generate different comparands to concurrently perform different lookups in the CAM blocks, as discussed below. In an alternative embodiment, processor 310 may transmit as-received unparsed header segments to CAM device 320.

Figure 3C:
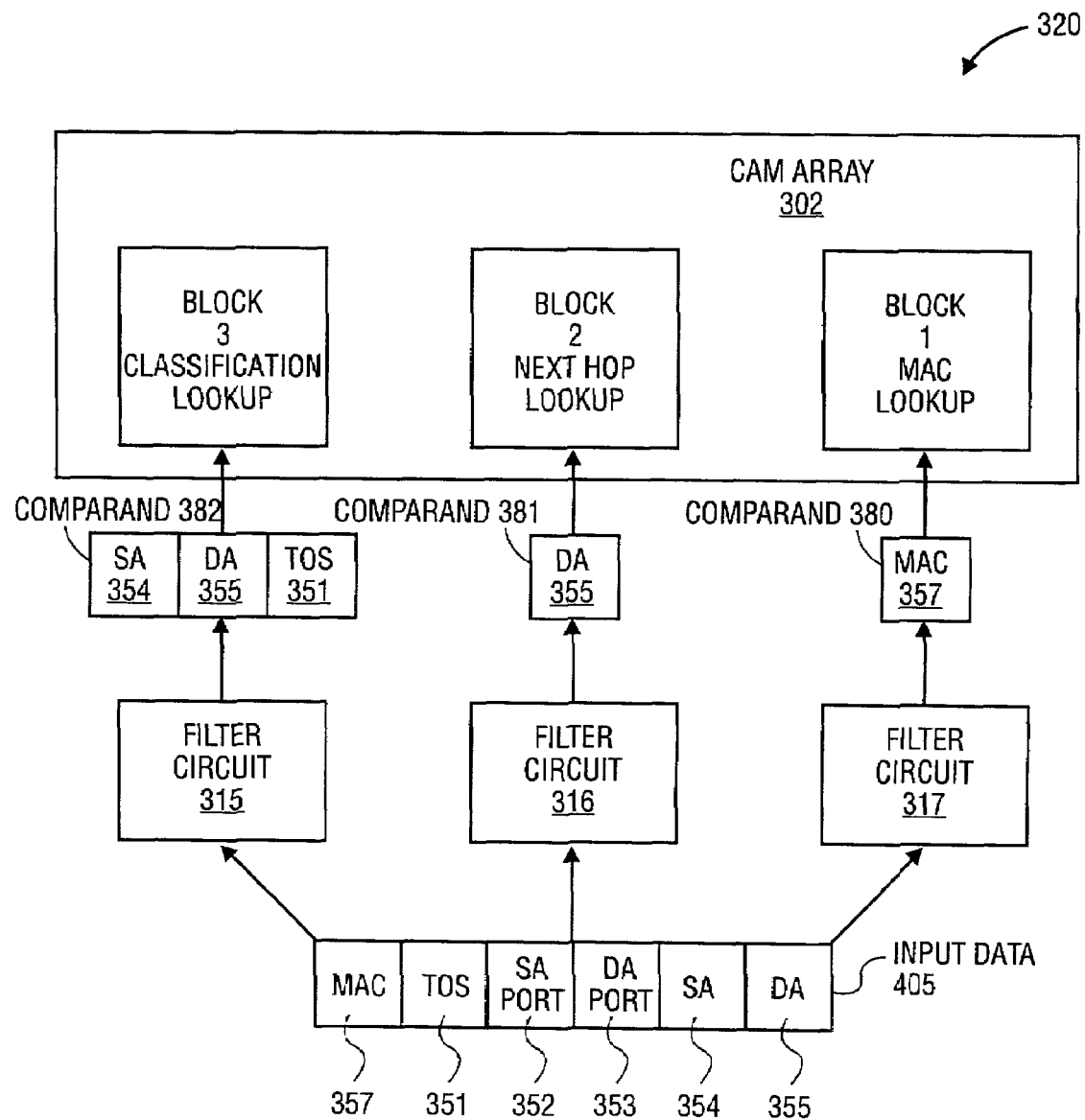
FIG. 3C illustrates a CAM device having multiple blocks or arrays of CAM cells that are coupled to corresponding filter circuits.

FIG. 3C illustrates a CAM device having multiple blocks or arrays of CAM cells coupled to a corresponding filter circuit. For example, CAM device 320 may include a CAM array 302 having multiple CAM array blocks 1, 2, and 3 with each array block coupled to a corresponding filter circuit 317, 316, and 315, respectively.

Each of the filter circuits 315–317 is configured to receive and process input data 405. The filter circuits 315–317 generate output data (e.g., by filtering, switching, translating, compacting, duplicating, and/or transposing, etc.) from input data 405, according to the needs of the user. Each of the filter circuits 315–317 may be programmed to select one or more bits or groups of bits from the input data 405 and situate them in particular positions of the output data 380–382. In one embodiment, for example, filter circuits 315–317 may be cross-bar switches or steering circuits. The input data 405 may include, for example, data for loading the CAM array in a write operation or data for comparison with data previously stored in the CAM array in a compare operation. Correspondingly the output data 380–382 generated by the filter circuits may be write data or a comparand, respectively.

In one embodiment, filter circuits 315–317 may be preprogrammed to translate particular segments of the input data 405 in order to perform concurrent lookups on the various tables stored in blocks 1–3. For example: filter circuit 317 may be programmed to select one or more bits or group of bits of MAC segment 357 to generate the comparand 380; filter circuit 316 may be programmed to select one or more bits or group of bits of DA segment 355 to generate the comparand 381; and filter circuit 315 may be programmed to select one or more bits or group of bits of SA segment 354, DA field segment 355 and TOS segment 351 to generate the comparand 382. By using multiple filter circuits to operate on one or more bits or group of bits of the different field segments from a common input data 405, in parallel, each of comparand 380–382 may then be used to perform the various lookups in the CAM blocks. For example: comparand 380 may be used to perform a MAC lookup in CAM block 1; comparand 381 may be used to perform a Next Hop (e.g., LPM) lookup in CAM block 2; and comparand 382 may be used to perform a Classification lookup in CAM block 3. In one embodiment, the lookups may all be performed concurrently. Alternatively, one or more of the lookups may be performed sequentially. In yet another embodiment, some, but not all, of the lookups may be performed concurrently.

As discussed above in relation to CAM 320 of FIG. 3A, a block array may be an entire array or a portion of a larger array. In addition, one or more blocks may have one or more block segments associated with it. Individual block arrays, or block array segments, may store different lookup tables. Alternatively, different block arrays, or block array segments, may store the same lookup table. Although three blocks are shown in FIG. 3C for ease of illustration, a CAM device may have more or less than three blocks in alternative embodiments.

Figure 4:
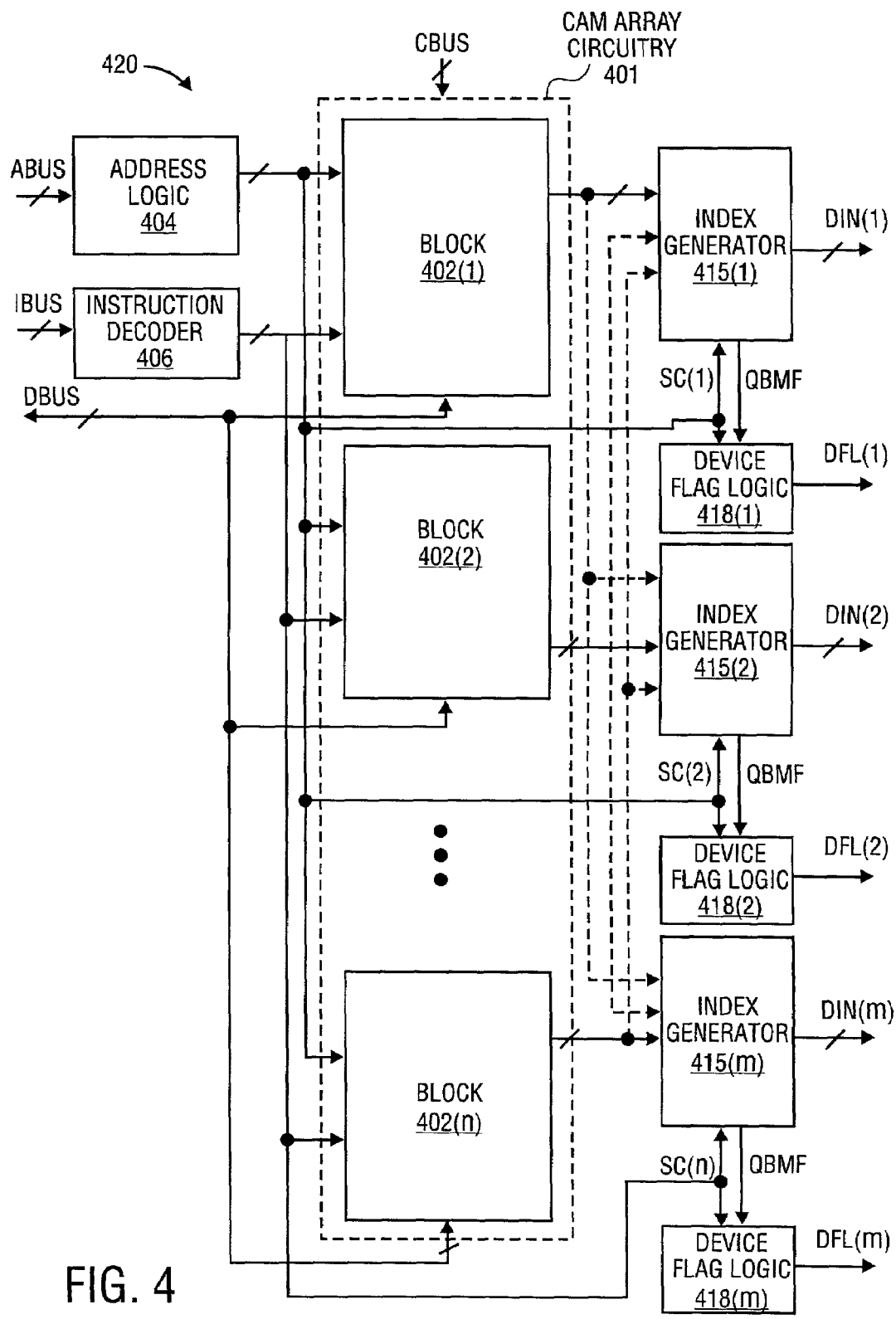
FIG. 4 illustrates one embodiment of a CAM device having a multiple CAM blocks and multiple index generators.

FIG. 4 illustrates one embodiment of a CAM device having a multiple CAM blocks and multiple index generators. In this embodiment, CAM device 420 includes CAM array circuitry 401 having blocks 402(1)–402(n), index generators 415(1)–415(m), device flag logic (DFL) 418(1)–418(m), address logic 404, and instruction decoder 406. CAM device 420 may be CAM device 320 of FIG. 3A. Each of blocks 402(1)–402(n) includes a CAM block array and associated circuitry, as discussed below in relation to FIG. 5A.

Instruction decoder 406 decodes various instructions provided on an instruction bus (IBUS). The instructions may include instructions to write data to CAM array circuitry 401, read data from CAM array circuitry 401, and to compare comparands with data stored in blocks 402(1)–402(n). The comparand may be provided on comparand bus (CBUS) directly to the CAM blocks 402(1)–402(n), or stored in one or more comparand registers each associated with a particular CAM array block (not shown). The CAM device 420 may also include one or more global mask registers (not shown) for the comparand provided to CAM array circuitry 401.

CAM array circuitry 420 may be instructed, for example, by processor 310 of FIG. 3A to compare one or more search keys (comparands), with data stored in a corresponding CAM array of on or more blocks 402(1)–402(n). The multiple data entries stored within a CAM block array are simultaneously compared with all, or a portion, of the comparand to identify matching entries. When the entire CAM block array of a particular block of blocks 402(1)–402(n) is searched simultaneously for a match of the stored data with the comparand, the CAM block array indicates the existence of a match by asserting a match flag. Additional flag logic such as almost full flag logic, full flag logic, and/or multiple match flag logic may also be included in CAM device 420. As discussed below in relation to FIG. 5A, each of the blocks 402(1)–402(n) includes a priority encoder to translate the matched location into a match address or index for the block (block match address or block index). The priority encoder of a block may also sort out which matching memory location has the top priority if there is more than one matching entry within a CAM array of the block.

The output of each CAM block 402(1)–402(n) is coupled to one or more (as indicated by the dashed lines in FIG. 4) of the index generators 415(1)–415(m). In one embodiment, all of the CAM blocks 402(1)–402(n), that are selected for a compare operation (as discussed below in relation to FIG. 5A), concurrently translate a matched location into a block index, and output this block index to index generators 415(1) to 415(m) (whose outputs DIN may be accessed by processor 310 of FIG. 3). In one embodiment, all of the CAM blocks 402(1)–402(n), that are selected for a compare operation, concurrently (overlapping at least a portion of time) identify which matching location has the top priority, if there is more than one matching entry within a block, and output a block match flag (or qualified block match flag as discussed below) to the index generators 415(1) to 415(m). Alternatively, one or more of the blocks 402(1)–402(n) may generate a corresponding block index and block match flag sequentially with respect to other blocks that may operate concurrently.

In one embodiment, each of the index generators 415(1)–415(m) concurrently receives the block indices and block match flags from each of the blocks 402(1)–402(n) and generates a device index (DIN) using at least one of the block indices and block match flags that corresponds to matched locations in a block 402. For example, if there is a highest priority match condition in the first CAM block 402(1) that is associated with index generator 415(1), then CAM block 402(1) provides a block index of its highest-priority match to index generator 415(1), where it is concatenated with the block identifier of CAM block 402(1) to generate the device index for CAM block 402(1) as discussed below in relation to FIGS. 5A and 6. Each of index generators 415(1)–415(m) may perform this operation for a corresponding one or more of the CAM blocks 402(1)402(n). In this manner, CAM device 420 may concurrently generate multiple device indices for one or more groups of CAM blocks 402(1)–402(n), and output the generated indices external to CAM device 420, for example, to processor 310.

When a device index, associated with a particular class code, is output from index generators 415(1)–415(m), a flag associated with the device index DIN indicates whether a match occurred for a particular search code. Device flag logic 418(1)–418(m) output device flag logic signals DFL(1)–DFL(m), respectively, indicating whether such a match occurred based on the received search code signal SC(1) to SC(n), respectively. DFL(1)–DFL(m) may be used, for example, to qualify (e.g., valid) the index output for another CAM device (not shown).

If more than one block 402 participates in a particular compare operation (i.e., each of the blocks have the same class code), a device index is generated by a selected index generator 415 corresponding to the participating blocks. If more than one block 402 participates in a particular compare operation, the corresponding index generator 415 may also sort out which matching entry from the multiple participating blocks 402 has the highest priority, if any, if there is more than one matching entry among the participating blocks 415.

In one embodiment, the device indices DIN(1)–DIN(m) of the index generators 415(1)–415(m) may be coupled to select circuitry, for example, a multiplexer (not shown) to select among the device indices DIN(1)–DIN(m) for output external to CAM device 420. Alternatively, all or more than one device index may be output on separate, dedicated output for access by, for example, processor 310.

It should be noted that in an alternate embodiment, CAM device 420 may have other configurations. For example, instruction decoder 406 may be omitted and various read, write and compare control signals may be provided directly to one or more of the circuit blocks. For another example, one or more bits of an address provided on the ABUS may be used as control signals. Address logic, instruction decoders, and read/write circuitry are known in the art; accordingly a discussion of their internal operation is not provided herein.

Figure 5A:
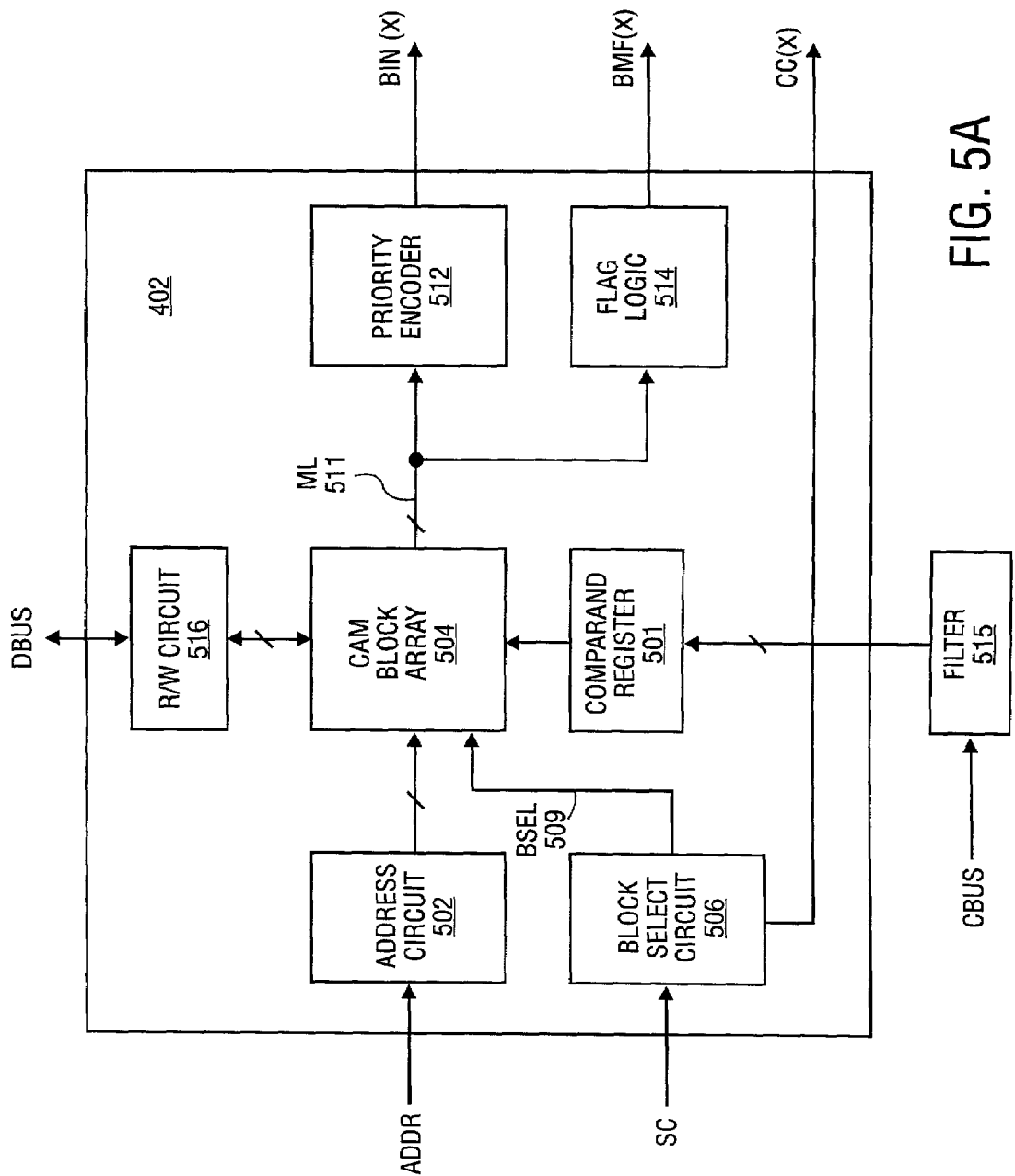
FIG. 5A illustrates one embodiment of a CAM block.

FIG. 5A illustrates one embodiment of the components within each of CAM blocks 402(1)–402(n) of FIG. 4. In this embodiment, CAM block 402 includes a CAM block array 504, address circuit 502, block select circuit 506, comparand register 501, priority encoder 512, flag logic 514 and read/write circuit 516. Alternatively, CAM block 402 may include fewer components (e.g., comparand register 501 may be omitted) or additional components (e.g., a global mask register) than shown in FIG. 5A. For another example, filter circuit 515 may reside internal or external to CAM block 402. Filter circuit 515 may operate in a similar manner to filter circuits 315–317 discussed above. For another example, alternatively, a common read/write circuit may be used for all of the CAM blocks.

Data may be written to CAM block 402 by read/write circuit 516 and address circuit 502. Address circuit 502 selects one or more rows of CAM cells of CAM block array 504 in response to an address ADDR received from address logic 404. The write data is provided to the selected CAM cells of block array 504 (e.g., over one or more data bit lines) by write circuitry within read/write circuit 516 (e.g., write buffers). Data is read from one or more selected rows of CAM cells of block array 504 by the read circuitry within read/write circuit 516 (e.g., by a sense amplifier).

CAM block array 504 includes a plurality of rows of CAM cells for storing a plurality of CAM words therein, and is connected to block select circuit 506. Each row of a CAM block array 504 may also include one or more valid bits indicative of whether a valid CAM word is stored in the row. The valid bits may be used in a well-known manner to generate e.g., a flag indication of the status of a CAM block (i.e., full flag, almost full, etc.) or to indicate the next free address (NFA) of a block for priority encoder 512. That information may be muxed out on the match lines 511. CAM block array 504 (and the other CAM arrays discussed herein) includes CAM cells that may be of any type of CAM cells including binary or ternary NAND and NOR based cells that may be formed from either volatile or non-volatile elements. Further, CAM blocks 402(1)–402(n) of FIG. 4 may be any suitable size, different sizes, or have programmable width/depth configurations. In one embodiment, for example, each of CAM block 402(1)–402(n) includes 1k (1024) rows of CAM cells.

During a compare operation, filter circuit 515 receives input data from the CBUS and may output a filtered (if desired), or unfiltered, comparand to comparand register 501. Other signals provided to the CAM device 420 during the compare operation may be a clock signal CLK, one or more instructions from instruction decoder; and other control signals. In some embodiments, instructions (e.g., SC) and comparand data may be provided to the CAM blocks 402 via the same bus. For example, instruction decoder 406 may provide one or more control signals to CAM block array 504, block priority encoder (PE) 512, block match flag logic (MF) 514, and block select circuit 506 to enable these circuits to perform their associated functions at an appropriate time. Other well-known signals that may be provided to CAM block 402, such as word enable signals, reset signals, and enable signals, are not shown for simplicity.

CAM block array 504 provides a plurality of match line signals to block priority encoder 512 via corresponding match lines (ML) 511. The match lines 511 carry match signals indicative of match conditions in the CAM block array 504. For simplicity, the plurality of match lines ML 511 for CAM block array 504 is represented collectively. The priority encoder 512 generates a block index corresponding to one of the matching CAM entries in the corresponding CAM block array 504. In one embodiment, the priority encoder 512 outputs the index BIN(x) of the highest priority match. The highest priority match may be the lowest numbered address, the highest numbered address, or any other selected address.

Referring back to FIG. 4, for purposes of discussion herein, the first CAM block 402(1) in the device 420 is designated as the highest priority block, the second CAM block 402(2) is designated as the next highest priority block, and so on, and the last CAM block 402(n) is designated as the lowest priority block, although in actual embodiments priority may be reversed or otherwise modified. Thus, the highest priority CAM block 402(1) may include the lowest CAM addresses (i.e., CAM addresses 0 to k-1), the next highest priority block 402(2) may include the next lowest CAM addresses (i.e., CAM addresses k to 2k-1), and so on, and the lowest priority CAM block 402(n) may include the highest CAM addresses (i.e., CAM addresses (n-1)k to nk-1.

A block select circuits 506 controls whether a corresponding CAM block arrays 504 in a CAM block 402(1)–402(n), respectively, participate in compare operations. Each block select circuit 506 stores a class code for its, corresponding CAM block array 504 that may be used to selectively disable the CAM block array from participating in, and therefore from affecting the results of, one or more compare operations. A class code, also referred to as table identification, may include various types of information. In one embodiment, each class code corresponds to a width/depth configuration of a CAM block so that the number of different class codes is determined by the number of permitted width/depth configurations. In an alternative embodiments, different class codes may be assigned according to other criteria including, without limitation, the type of data stored within the corresponding CAM array tables (e.g., ATM, IPv4, IPv4 multicast, Ethernet, URL, MPLS, etc.); the type or purpose of the operation to be performed on the data stored within the corresponding CAM array (e.g., one class may be used to determine forwarding addresses, while another class may be used for classification purposes), or by any combination of data type, storage configuration, or operation type/purpose. By assigning different class codes to various operations, it becomes possible to perform operations (e.g., compare, write, read) on the specific CAM blocks containing those values, regardless of whether those CAM blocks have the same or different width/depth configurations.

During a compare operation, a comparand is provided to the CAM block array 504, and a search code is provided to the block select circuit 506 via bus SC. The search code may be generated by instruction decoder 406 or may be directly provided over a separate bus. In an alternate embodiment, the search code may be provided as part of the comparand, in which case the CBUS is connected to the block select circuit 506. Each block select circuit 506 compares the received search code with its stored class code, and in response thereto, selectively disables (or alternatively enables) the corresponding CAM block array 504 from participating in the compare operation via a block select signal BSEL 509.

Figure 5B:
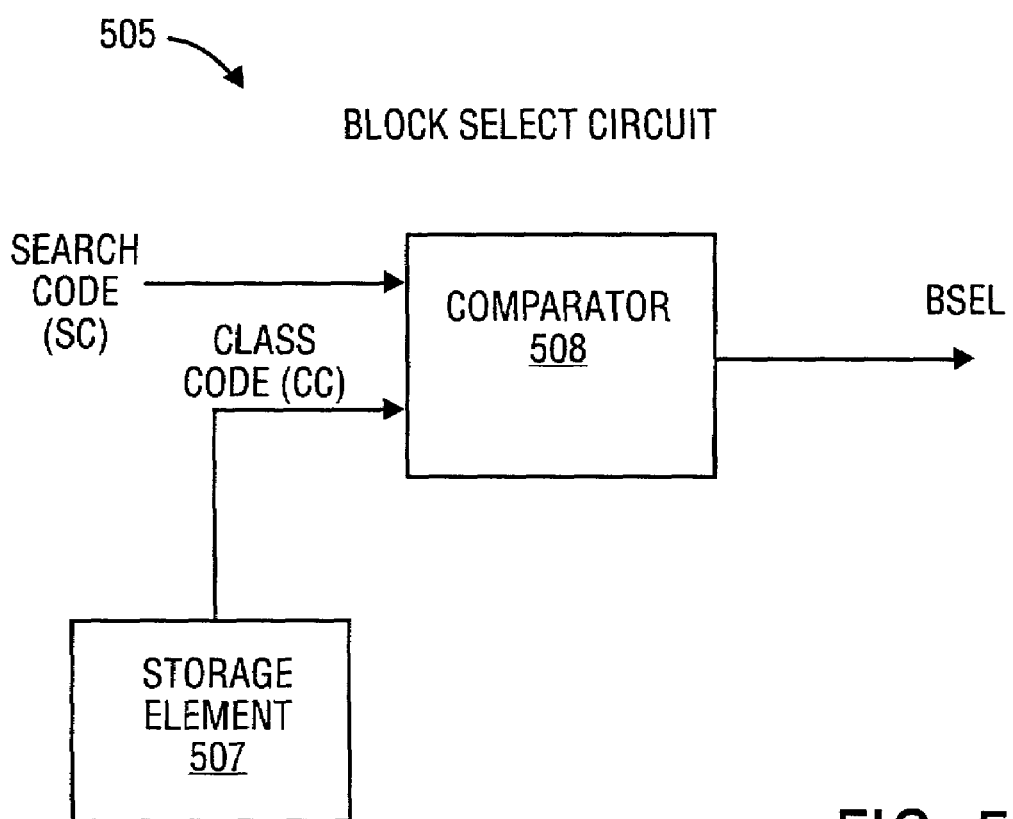
FIG. 5B illustrates one embodiment of a block select circuit.

FIG. 5B illustrates one embodiment of a block select circuit. In this embodiment, block select circuit 505 includes a storage element (e.g., a register) 507 to store the class code and a comparator 508 coupled to receive the search code and the class code and perform the comparison. Alternatively, block select circuit 505 may have other components and circuit configurations to perform its operation.

Referring back to FIG. 5A, in one embodiment, the block select circuit 506 enables CAM block array 504 to participate in the compare operation if the class code matches the search code and, conversely, disables the corresponding CAM block array 504 if the class code does not match the search code. In an alternative embodiment, the output of the block select circuit 506 may be provided to one or more of the other components in CAM block 402 to selectively enable/disable such components, for examples, block priority encoder 512, the block match flag logic 514, and a comparand register 512. BSEL 509 may, alternatively disable PE 512 or flag logic 514.

The class codes assigned to the CAM block arrays 504 may be used to partition the device 420 into the individually selectable partitions of one or more CAM blocks 402(1)–402(n). For example, in one embodiment, data stored in the first CAM block array 504 of CAM block 402(1) may be assigned to a first class by storing a first class code in block select circuit 506 of CAM block 402(1), data stored in the second CAM block array 504 of CAM block 402(2) may be assigned to a second class by storing a second class code in block select circuit 506 of CAM block 402(2), and data stored in the remaining CAM block arrays may be assigned to a third class by storing a third class code in block select circuits of CAM block 402. Then, for example, data stored in the first CAM block array 504 of CAM block 402(1) may be selected for searching by setting the search code to match the first class code stored in the block select circuit 506 of CAM block 402(1).

When the search code matches the first class code, the block select circuit 506 of CAM block 402(1) enables the first CAM block array 504 of CAM block 402(1) to compare the comparand with its stored data corresponding to the first class code. If the search code does not match the second and third class codes, the remaining block select circuits disable the corresponding, unselected CAM block array 504 of CAM blocks 402(2)–504(n). When disabled, the unselected CAM blocks 402(2)–402(n) do not drive the comparand into their respective CAM block array 504 for the compare operation, thereby precluding comparison with unselected data corresponding to the second and third class codes. In this manner, CAM blocks 402(1)–402(n) may be selectively searched according to class assignments, thereby allowing for a dynamically partition-able CAM device 420.

Since the comparand is not compared with data stored in the disabled CAM blocks 402(2)–402(n), the disabled CAM blocks 402(2)–402(n) consume much less power during the compare operation than does the selected, enabled CAM block 402(1). In this manner, the class codes may not only restrict compare operations to data in the selected CAM block(s), but also may minimize power consumption of the unselected CAM block(s) during compare operations. The advantage of reduced power consumption in unselected CAM blocks during compare operations achieved by present embodiments may be particularly useful in applications where power consumption is a concern.

The ability to selectively enable or disable one or more CAM blocks from participating in compare operations may be especially useful for combining routing look-up functions for different classes of networks in a single device 420. For example, in one embodiment, routing information for a first virtual private network (VPN) may be stored in a first CAM block 402(1), routing information for a second VPN may be stored in a second CAM block 402(2), routing information for a web search may be stored in a third block 402(3), and routing information for a local area network (LAN) may be stored in a fourth CAM block 402(4). Four unique class codes may be stored in corresponding block select circuits 506. Of course, more than one CAM block may be assigned to a particular network by storing the appropriate class code in more than one block select circuit 506. During compare operations, comparand data corresponding to routing functions of one of these four networks may be exclusively compared with data stored in the corresponding CAM block(s) by simply setting the search code to match the appropriate class code. In some embodiments, an associative RAM may be partitioned into four partitions corresponding with the four class-defined partitions in the CAM device 420.

During compare operations, a comparand provided on CBUS is compared to data stored in all enabled CAM block arrays 504 of CAM blocks 402(1)–402(n). For each enabled CAM block array 504, if there is a match condition in response to the compare operation, the corresponding block match flag logic 514 asserts a match flag to a logic high state, and the corresponding block priority encoder 512 within the block 402 outputs a block index (e.g., a 12 bit row address if the block array has 4K rows), or address, of the highest priority matching CAM row in the block array 504. If there is not a match, the block match flag BMF(x) is not asserted (i.e., block match flag logic 514 sets BMF(x) to a low logic state). Additional flag logic such as almost full flag logic, full flag logic, and/or multiple match flag logic may also be included in a block 402. For one embodiment, block match flag logic 514 includes a programmable element (e.g., a fuse or other memory element) that is programmed when the CAM block 402 is disabled. Priority encoders, match flag logic, block select circuits, and CAM arrays are known in the art; accordingly a discussion of their internal operation is not provided herein.

In one embodiment, block select circuit 506 also provides BSEL 509 to block match enable circuits 691(1)–691(n) as discussed below in relation to FIG. 6. The block match enable circuits 691(1)–691(n) receive the BMF and outputs a qualified block match signal QBMF to priority encoder 680 based on whether BSEL indicates that the current compare operation is intended for the class of data stored in the block array 504.

Figure 6:
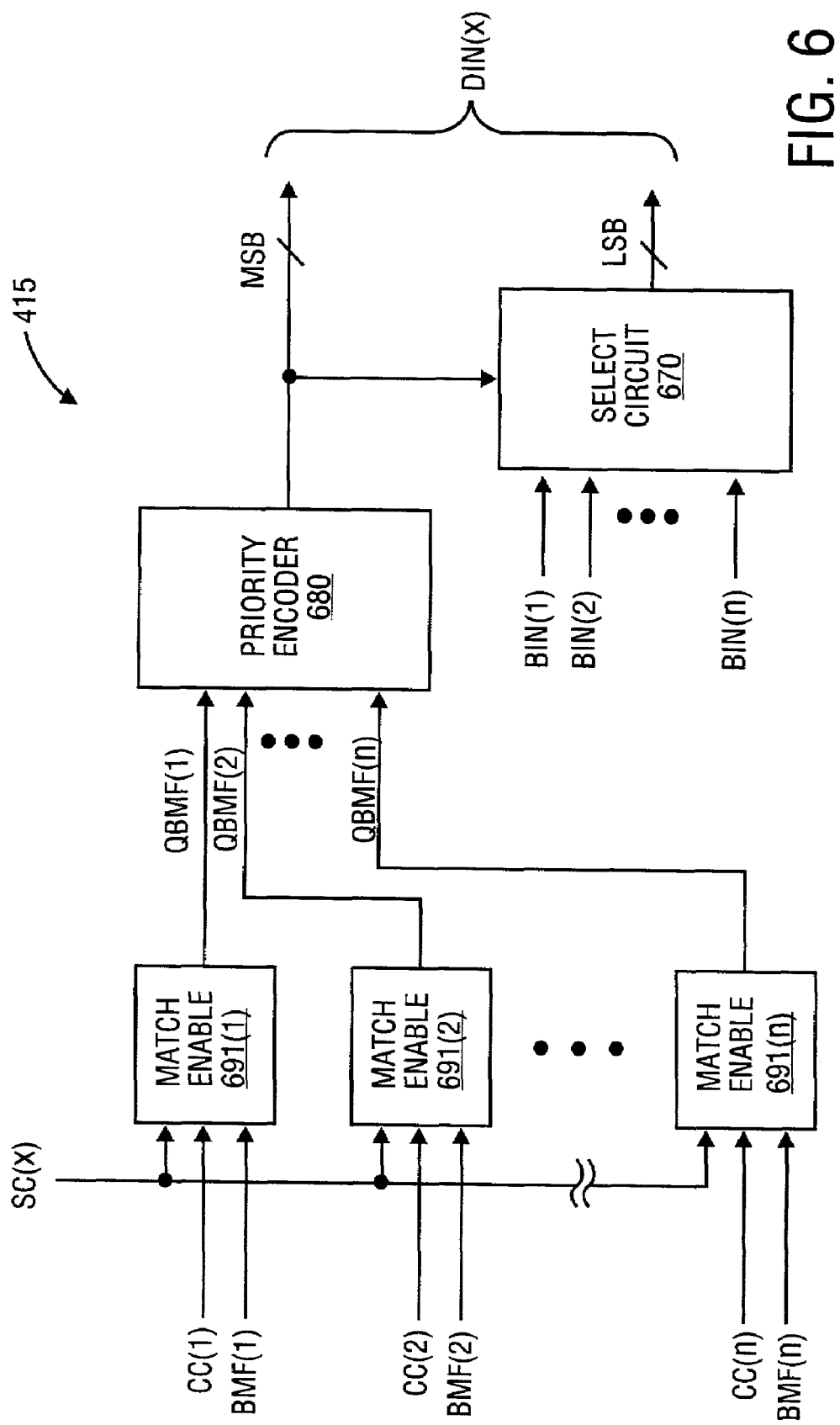
FIG. 6 illustrates one embodiment of an index generator.

FIG. 6 illustrates one embodiment of index generator 415. In this embodiment, index generator 415 includes priority encoder 680, select circuit 670, and match enable circuits 691(1)–691(n). As such, each of index generators 415(1)–415(m) of FIG. 4 includes the group of match enable circuits 691(1)–691(n). Each index generator 415(1)–415(m) of FIG. 4 is associated with a particular search code SC(x).

Match enable circuits 691(1)–691(n) within an index generator 415 are configured to receive the class codes CC(1)–CC(n) and the block match flags BMF(1)–BMF(n) from each of the CAM blocks 402(1)–402(n), and the search code SC(x) associated with the particular index generator 415. The match enable circuits 691(1)–691(n) generate qualified block match flag signals QBMF(1)–QBMF(n) when both the search code associated with the index generator matches a class code of a CAM block and there is a match in a selected block indicated by the BMF signal. In an alternative embodiment, match enable circuits 691(1)–691(n) may reside within device flag logic 491 or external to either index generator 415 or device flag logic 491.

Priority encoder 680 is coupled to receive the qualified match flag signals QBMF(1)–QBMF(n) from each of the blocks 402(1)–402(n) that indicates a matching entry within a corresponding block and outputs the address of the matching entry having the highest priority among the multiple blocks 402(1)–402(n). During a compare operation associated with a particular class code, the QBMF signals indicate which blocks are assigned to the particular class code and have a matching entry. PE 680 determines which of the blocks has the highest priority matching entry and outputs its block index. In one embodiment, the output of priority encoder 680 is provided as the most significant bit (MSBs) of the device index DIN(x) output from index generator 415.

The output of priority encoder 604 is also coupled as a control input to select circuit 670. Select circuit 604 is coupled to receive the block indices BIN(1)–BIN(n) from each of the blocks 402(1)–402(n) and output the particular block index from the highest priority block as determined by the output of priority encoder 680. In one embodiment, for example, select circuit 670 may be a multiplexer. In one embodiment, the output of select circuit 670 is provided as the least significant bits (LSBs) of the device index DIN(x) output from index generator 415.

In one embodiment, the index generator 415 is programmable and stores the block identifiers for CAM blocks 402(1)–402(n) in memory (not shown). For example, the block identifiers are dynamic values that may be modified or programmed to reflect and thus maintain consistency with address translations used during read or write operations to calculate the address or index of a matching CAM row during compare operations. For example, for a CAM device having four blocks 402(1)–402(4), the index generators 415(1)–415(4) may initially store a block identifier of "00" for CAM block 402(1), a block identifier of "01" for CAM block 402(2), a block identifier of "10" for CAM block 402(3), and a block identifier of "11" for CAM block 402(4).

For one embodiment, one or more CAM blocks 402 are disabled and removed from the overall address space (e.g., because the disabled blocks contain one or more defective bits), the block identifiers stored in index generators 415(1)–415(m) are modified to reflect address translations during the read or write operation. For example, if CAM blocks 402(1) and 402(3) are disabled, the address spaces in CAM blocks 402(2) and 402(4) can be translated to address space 0 to k-1 and address space k to 2k, respectively, index generators 415(1)–415(4) may add a block identifier of "00"

to row block index BIN(2) to generate the device index for CAM block 402(2) and add a block identifier "01" to row block index BIN(4) to generate the device index for CAM block 402(4). In this manner, address consistency between read/write operations and compare operations can be maintained.

Figure 7:
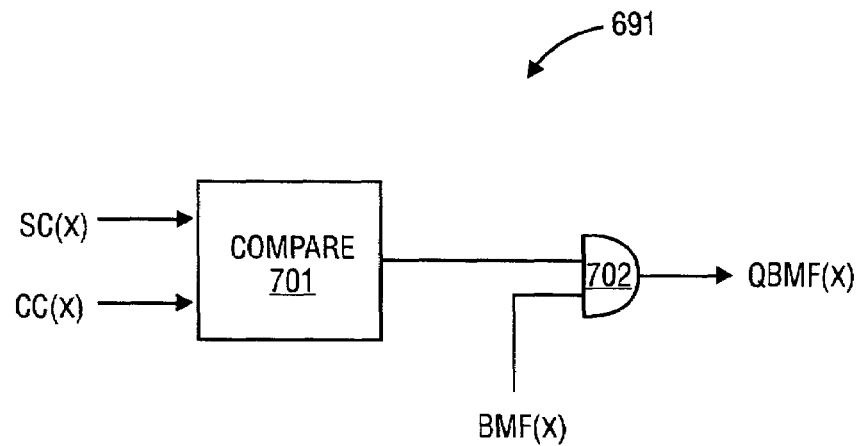
FIG. 7 illustrates one embodiment of match enable circuitry.

FIG. 7 illustrates one embodiment of a match enable circuit. In this embodiment, for example, block match enable circuit 691 includes compare circuitry 701 coupled to logic circuitry 702 (e.g., an AND gate). Compare circuitry 701 compares received signals SC and CC and outputs an indication when the receive signals match. In one embodiment, the output of compare circuitry 701 may logically be operated on with the BMF(x) signal to generate a qualified block match flag QBMF(x) signal when both the search code matches the class code and there is a match in a selected block indicated by BMF(x). In an alternative embodiment, block match enable circuit 691 may have other circuit configurations.

Figure 8:
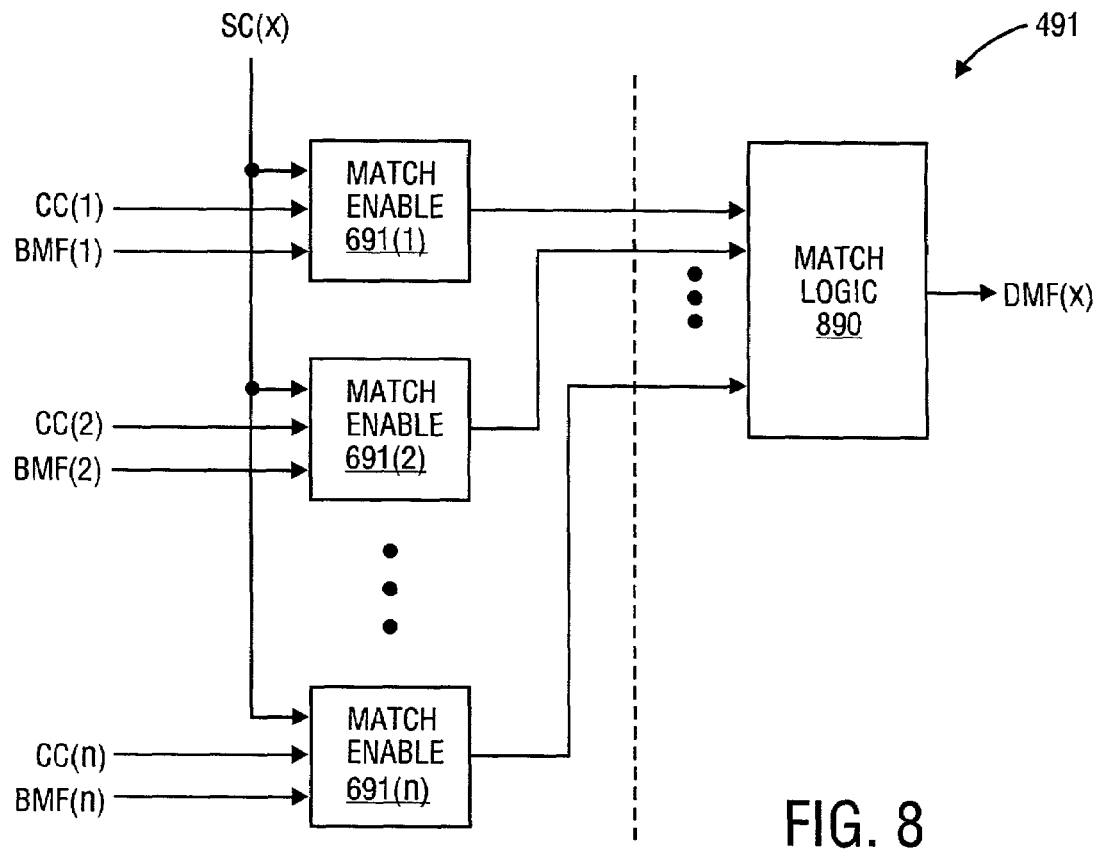
FIG. 8 illustrates one embodiment of device flag logic.

FIG. 8 illustrates one embodiment of device flag logic. In this embodiment, each of device flag logic 418(1)–418(m) of FIG. 4 includes a match logic circuit 890. Match logic 890 receives the outputs of match enable circuits 691(1)–691(n) and outputs a device match flag DMF(x) when the search code matches the class code for a particular enable CAM block. Match logic 890 may include, for example, an AND gate, and is known in the art. Alternatively, device flag logic 491 may include additional flag logic such as almost full flag logic, full flag logic, and/or multiple match flag logic. In an alternative embodiment, device flag logic 491 may include its own match enable circuitry (separate from match enable circuitry 691).

Figure 10:
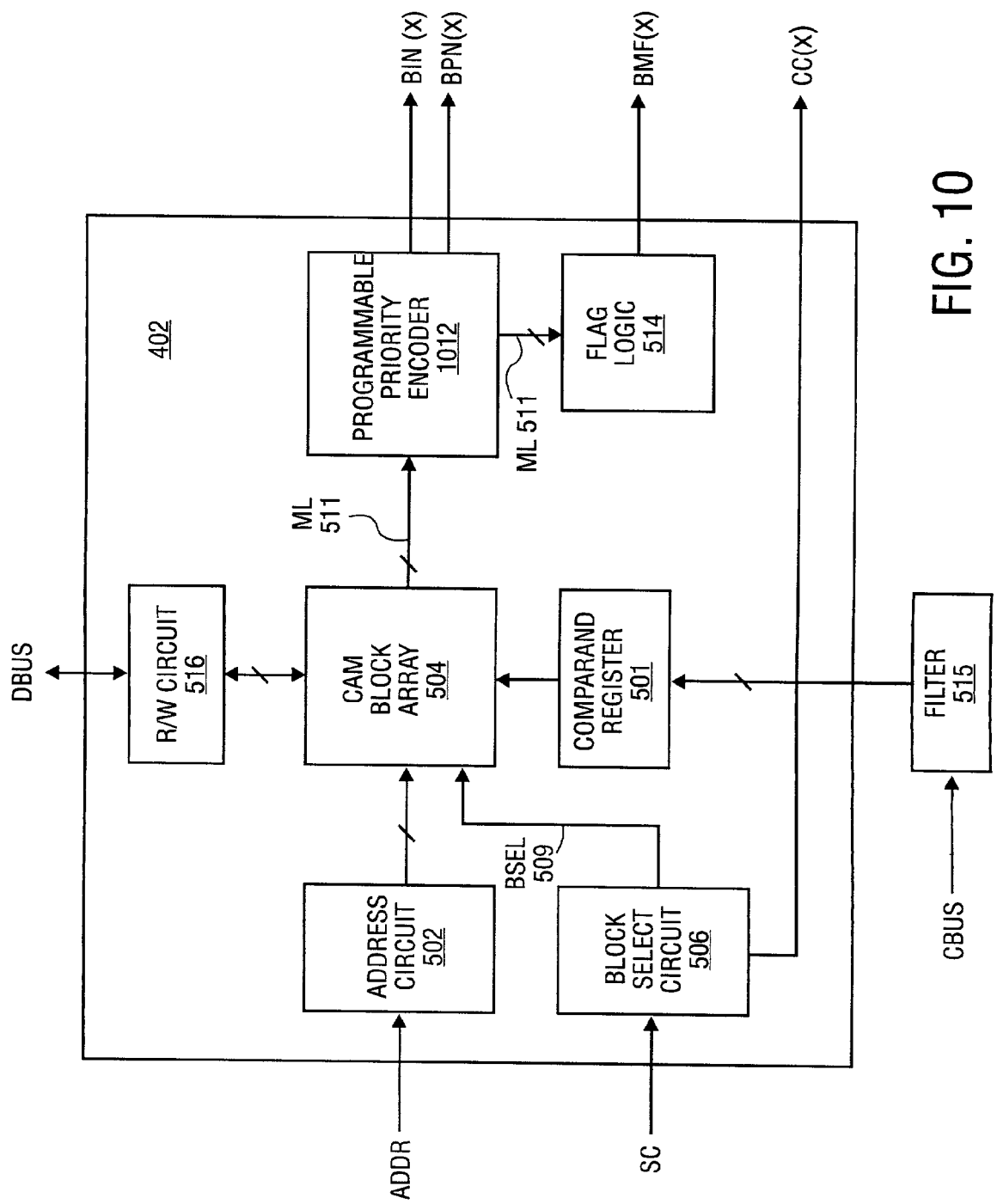
FIG. 10 illustrates an alternative embodiment of a CAM block having a programmable priority encoder.

FIG. 10 illustrates an alternative embodiment of a CAM block having a programmable priority encoder. In this embodiment, CAM block 402 includes programmable priority encoder 1012 coupled to CAM block array 504. Each entry stored in a CAM block array 504 has associated with it a priority number that indicates the priority of the data relative to other data in the array 504. The priority numbers are programmed into programmable priority encoder 1012. For a compare operation, programmable priority encoder 1012 determines the address or index of the entry in CAM block array 504 that stores data that matches a comparand and that has the highest priority (most significant) programmed priority number BPN(x) (i.e., if there are multiple matches). The most significant priority number may be the priority number with the lowest or highest numerical value.

Figure 11:
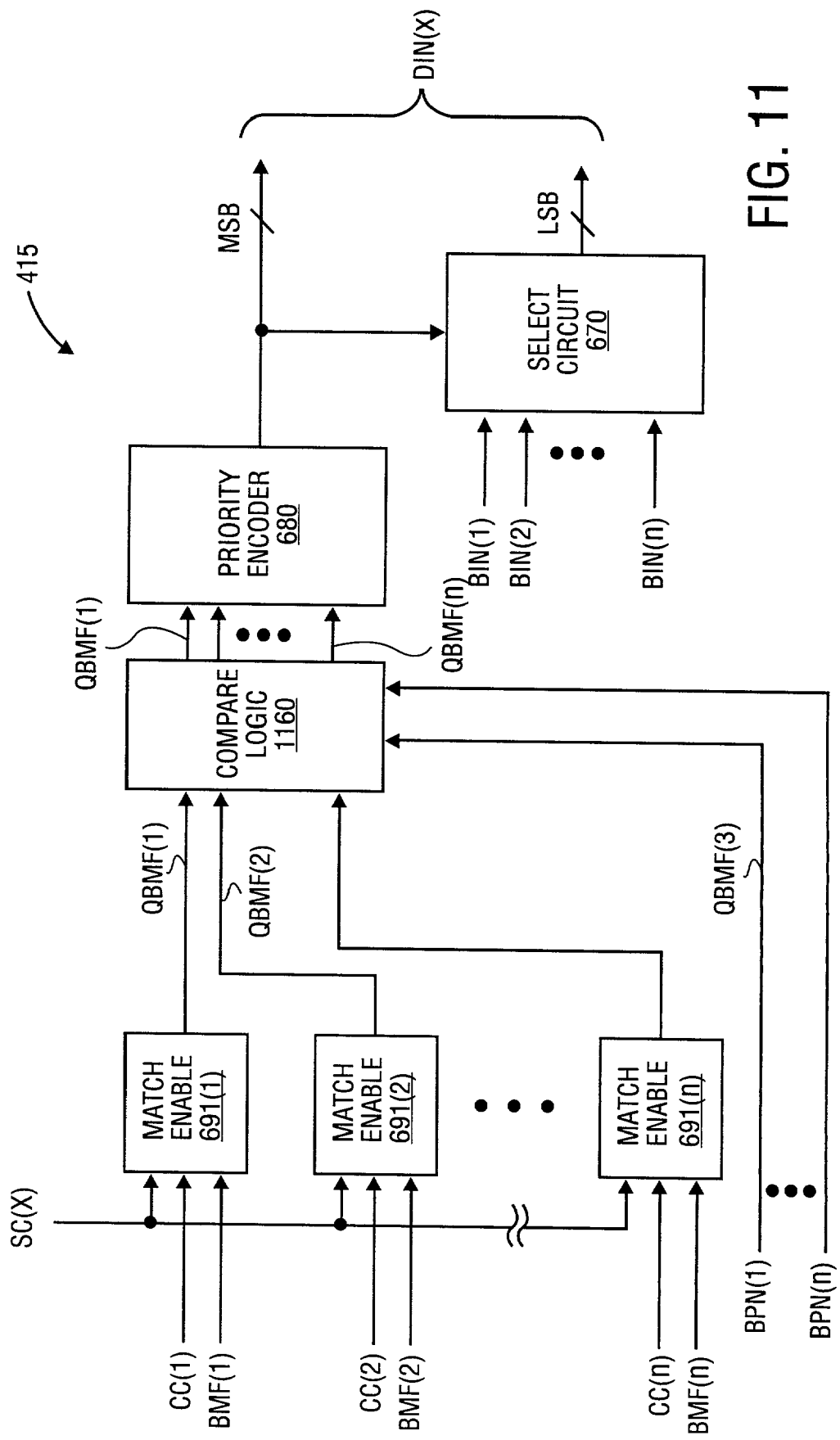
FIG. 11 illustrates an alternative embodiment of an index generator.

The most significant, or highest priority number from each CAM block is provided to the index generators 415 of FIG. 11. In this embodiment, index generator 415 of FIG. 11 includes compare logic 1160 coupled to receive the qualified block match flags from match enable circuits 691(1)–691(n) and the block priority numbers BPN(1)–BPN(n). Compare logic 1160 compares the highest priority numbers BPN(0)–BPN(n) from each of the CAM blocks 402(1)–402(n) for all qualified match flags that indicate a match, and outputs to priority encoder 680 an identification (QQBMF (1-n)) of which CAM block has the highest priority match. That is, compare logic 1160 qualifies the QBMF signals such that a QQBMF signal, associated with a corresponding QBMF signal, remains in an asserted state (indicating a match from the corresponding CAM block) only if its BPN is the most significant BPN. If more than one CAM block has the same BPN (and a match), then both of the QQBMF signals will be asserted and priority encoder 680 will determine the address of the higher priority CAM block based on physical location of the CAM block in the address space.

Such an embodiment obviates the need to preload data in a predetermined order in the CAM block array. Instead, the programmable priority encoder 1012 determines the most significant priority number from among matching entries regardless of the order in which data is stored in the array. This can reduce the hardware and/or software needed for table management and can increase the performance of a router. In addition, new data can be added at any location in the CAM array 504 and associated priority numbers loaded into programmable priority encoder 1012.

Figure 15:
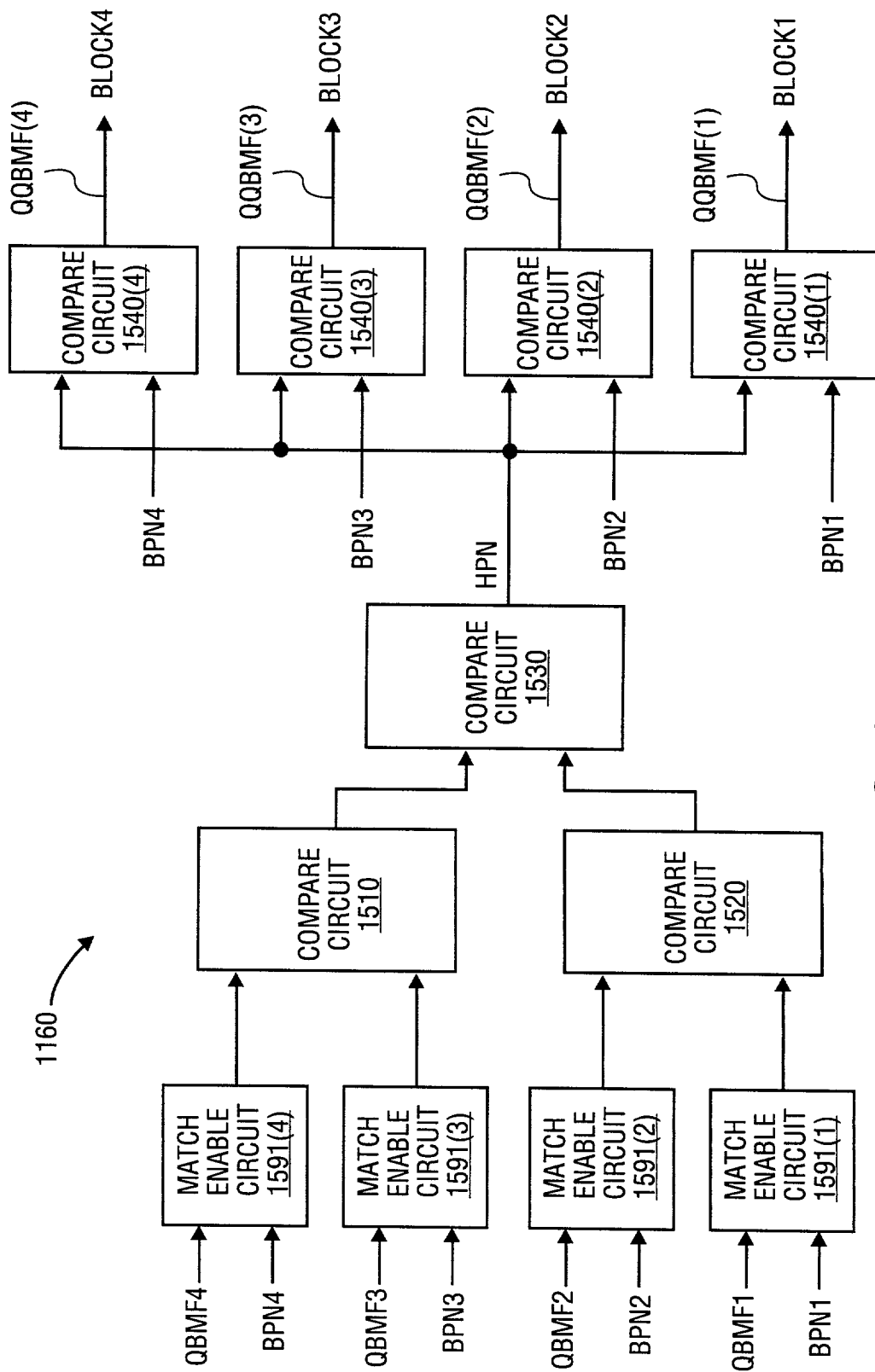
FIG. 15 illustrates one embodiment of compare logic.

FIG. 15 illustrates one embodiment of compare logic 1160 of FIG. 11 corresponding to an exemplary CAM device having four CAM blocks. In this exemplary embodiment, compare logic 1160 includes match enable circuits 1591(1)–1591(4), compare circuits 1540(1)–1540(4), and compare circuits 1510, 1520 and 1530. Match enable circuits 1591(1)–1591(4) are configured to receive the qualified block match enable signals QBMF from the match enable circuits 691 and the block priority numbers BPN from the programmable priority encoders 1012 from each of the CAM blocks and generate output signals based on matches of the received signals. That is, if a QBMF is asserted to a high logic state indicating a match, then the corresponding BPN for that CAM block is provided to the compare logic unaltered; however, if the QBMF is asserted to a low logic state indicating a mismatch, then the corresponding BPN for that CAM block is provided to the compare logic is a default state (e.g., as the least significant priority number). The outputs of the match enable circuits 1591(1)–1591(4) are coupled to compare circuits 1510, 1520, and 1530 in a cascade fashion to compare the BPN of all the enabled blocks and determine the highest priority number among the group. This highest priority number (HPN) is provided to compare circuits 1504(1)–1504(4) to determine the CAM block associated with that highest priority number, and the QQBMF signals set accordingly.

Four qualified block match flag signals and block priority number signals, associated with four CAM blocks, are shown only for ease of discussion. It will be apparent to one of skill in the art that additional (or fewer) match enable circuitry and compare circuitry coupled in a cascade fashion may be used to implement compare logic 1160 having a greater (or lesser) number of QBMF and BPN signals received from a corresponding number of CAM blocks. In addition, any logic or circuitry may be used to implement the function of compare logic 1160.

Figure 12:
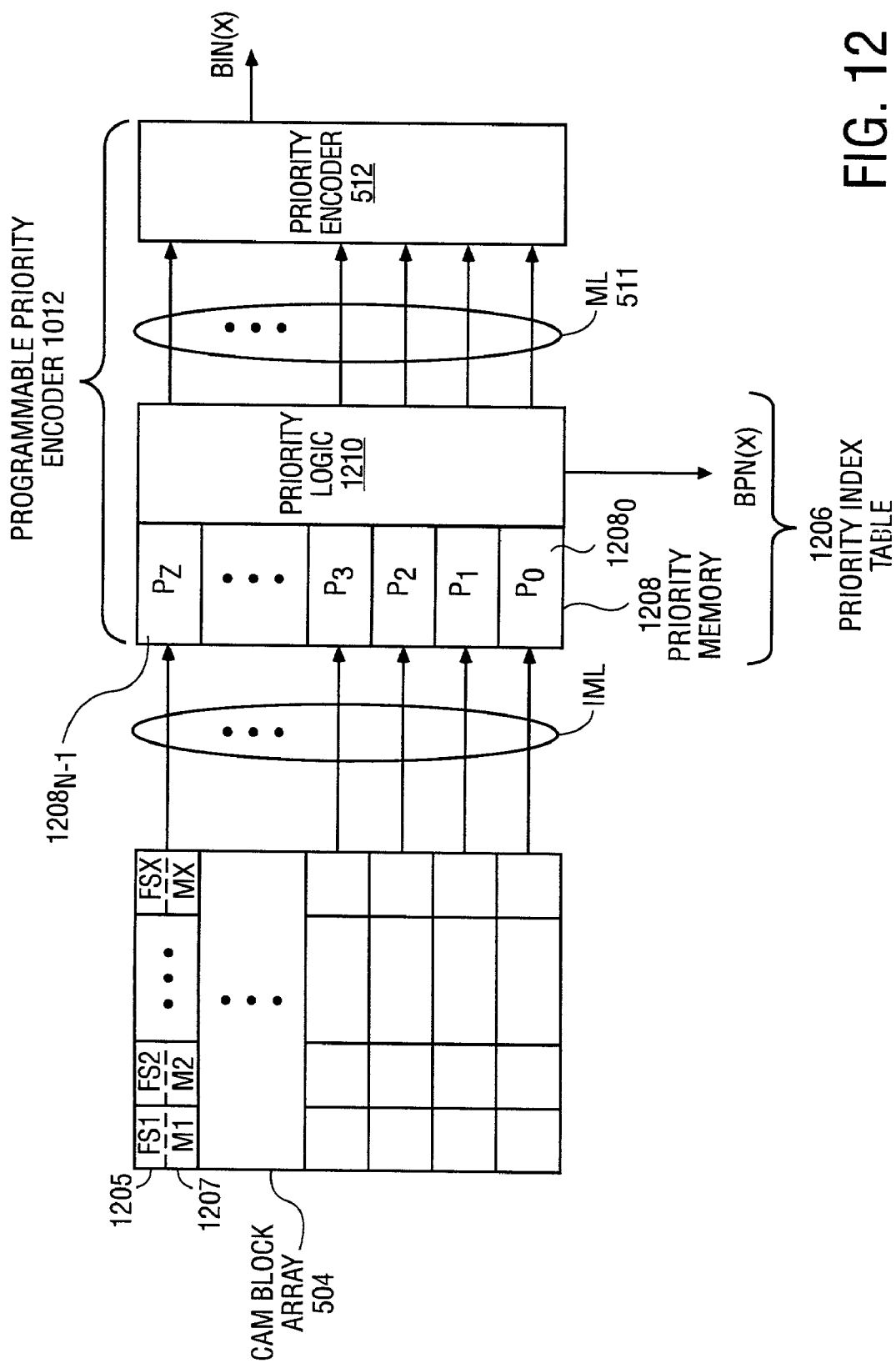
FIG. 12 illustrates one embodiment of a programmable priority encoder.

FIG. 12 illustrates one embodiment of a programmable priority encoder 1012. In this embodiment, programmable priority encoder 1012 includes priority encoder 512 and priority index table 1206 having priority memory 1208 and priority logic 1210.

For this exemplary embodiment, CAM block array 504 is a ternary CAM block array that stores data groups (e.g., data words). Ternary CAM block array 504 has rows of CAM cells 1205 for storing field segment data FS1–FSX, where X is any number. Each field segment may include any number of bits as discussed above. Additional information associated with each field segment may be stored in one or more additional binary or ternary CAM cells or other types of memory cells disposed in each row of CAM block array 504. Ternary CAM block array 504 also has rows of mask cells 1207 for storing mask data M1–MX corresponding to each row 1205 of data groups. Global masks (not shown) may be used to mask entire columns in CAM block array 504 as mentioned above. Also as previously mentioned, for alternative embodiments, CAM array 504 may be any other type of CAM including a binary CAM, or any other type of memory to store data groups to be compared with comparands generated based on an incoming packet.

Continuing the example of this embodiment, ternary CAM array 504 can be any ternary CAM array that is capable of locally masking each entry on a bit-by-bit basis. Each field segment that corresponds to a match clause for a given comparand segment will be unmasked by having its corresponding mask bits set, for example, to a logic zero (or, alternatively, a logic one). Conversely, each field segment that does not have a match for a given comparand segment will be masked by having its corresponding mask bits set, for example, to a logic one (or, alternatively, a logic zero).

Each data group (e.g., word) loaded into ternary CAM block array 504 has associated with it a priority number $P_0$–$P_z$. The priority number indicates the priority of the data group relative to other data groups in the array. The data groups may be programmed by a user of CAM device 320 of FIG. 3 including, for examples, a network administrator or the router itself. The priority numbers $P_0$–$P_z$ are separately stored at locations $1208_0$–$1208_{N-1}$, respectively, of priority memory 1208 of programmable priority encoder 1012. Priority memory 1208 may be any type of memory array including volatile, non-volatile, random access memory (RAM), and/or read only access memory (ROM). For one embodiment, priority memory 1208 comprises a CAM array. Priority memory 1208 may be n bits wide to accommodate $Z=2^n$ priority numbers, where n is any number. The number of addressable locations N in priority memory 1208 may be greater than, less than, or equal to Z.

The priority numbers may be assigned in ascending priority order such that zero is the highest priority number and $2^n-1$ is the lowest priority number. Alternatively, the priority numbers may be assigned in descending priority order such that $2^n-1$ is the highest priority number and zero is the lowest priority number. Each priority number may be assigned so as to identify the priority of each data group relative to other data groups. For one embodiment, the priority numbers may be assigned consecutively. For example, the highest priority data group can be assigned the highest priority number (e.g., zero or $2^n-1$), the next lower priority data group can be assigned the next lower priority number (e.g., one or $2^n-2$), and so forth. For another embodiment, gaps may be left in the priority number assignments to allow for the addition of future priority numbers associated with new data groups.

Priority index table 1206 also includes priority logic 1210 that compares the priority numbers with each other for all corresponding data groups that match a comparand. Priority logic 1210 identifies the most significant priority number BPN in memory 1208 from among the compared priority numbers. For one embodiment, BPN has the lowest numerical value when the priority numbers are assigned in ascending priority order, and BPN has the highest numerical value when the priority numbers are assigned in descending priority order. The identified location of BPN in the priority memory is provided on match lines (ML) 511 to encoder 512. Priority encoder 1512 operates in the manner as discussed above.

As mentioned above, new data can be added at any location in the ternary CAM block array 504 and associated priority numbers loaded into corresponding locations of the priority index table 1206. The data and the associated priority numbers do not need to be pre-ordered in any manner. In one embodiment, for example, priority index table 1206 may be implemented similar to the compare logic 1160 of FIG. 15.

Figure 13:
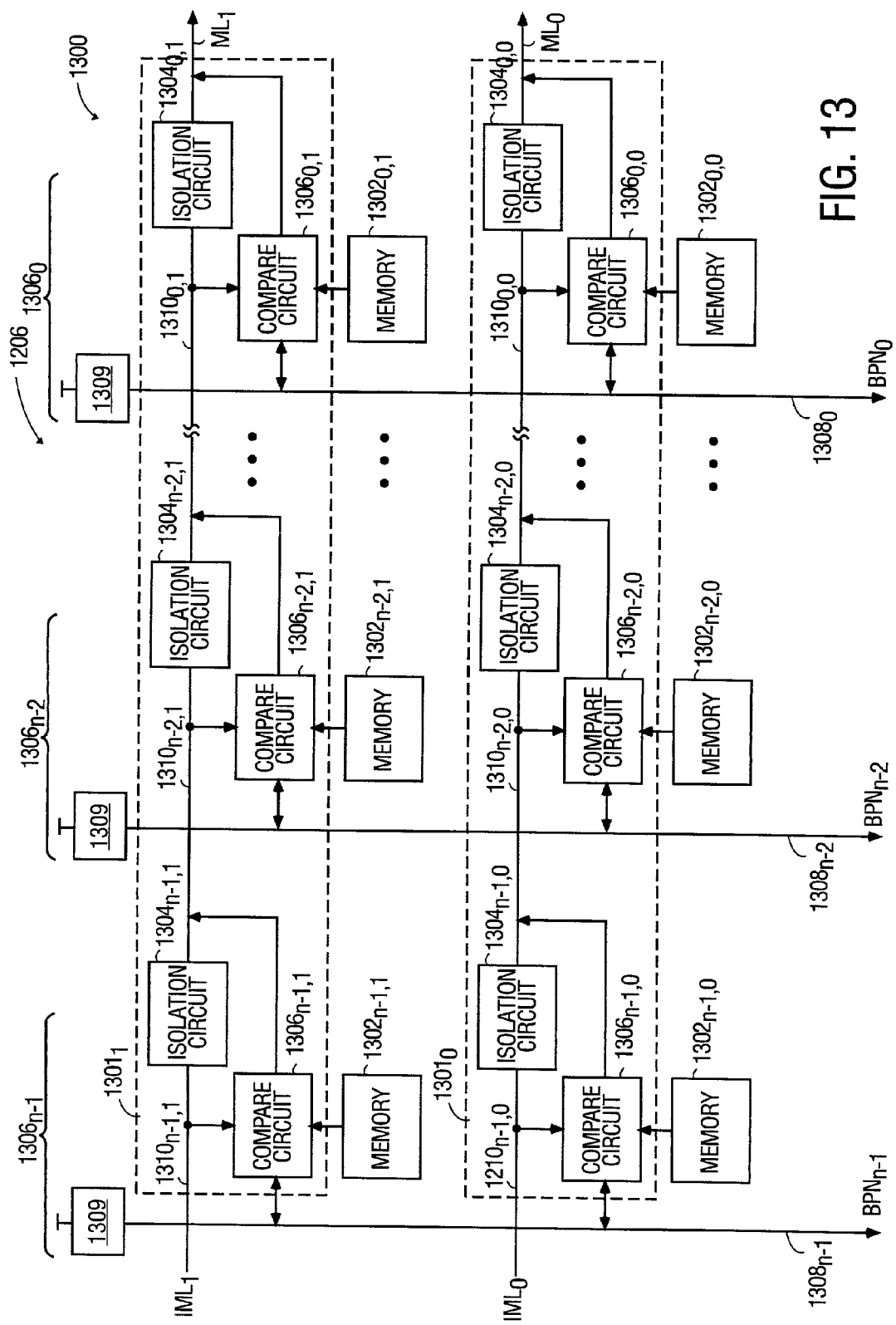
FIG. 13 illustrates one embodiment of two rows of a priority index table.

FIG. 13 illustrates one embodiment of two rows of a priority index table. For this embodiment, priority index table 1206 includes isolation circuits 1304, compare circuits 1306, and memories 1302. Each compare circuit 1306 is connected in a wired-OR configuration with the other compare circuits in its respective column by one of priority signal lines $1308_0$–$1308_{n-1}$. Each priority signal line may be pre-charged towards a power supply voltage (or any other predetermined voltage) by a pre-charge circuit 1309. Each compare circuit 1306 may be any digital or analog compare circuit that effectively compares the priority number bit stored in its respective storage element 1302 with the priority number bits stored in every other storage element 1302 of the same column. Additionally, each compare circuit monitors the comparison result of the more significant priority number bits through the logical states of internal match line segments 1310. Internal match line segments 1310 are coupled between internal match lines $IML_0$–$IML_{N-1}$ and match lines ML 511 by isolation circuits 1304. The isolation circuits 1304 isolate the comparison results generated for less significant priority bit locations from affecting the comparison results generated for more significant priority bit locations. The isolation circuits 1304 may also work together with the comparison circuits 1306 to control the state of the match line segments. Any logic or circuitry may be used to implement compare circuit 1306 and isolation circuit 1301.

Figure 14:
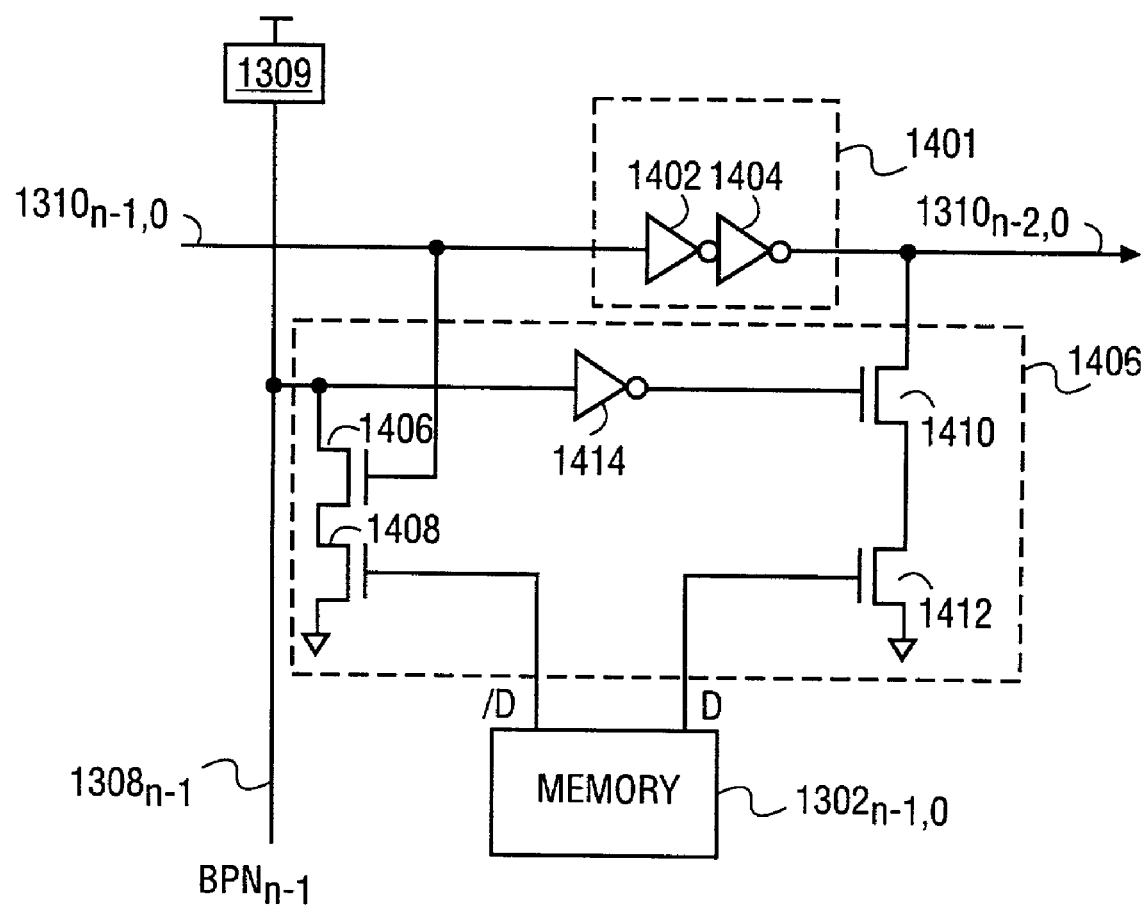
FIG. 14 illustrates one embodiment of a compare circuit and an isolation circuit.

FIG. 14 illustrates one embodiment of compare circuit 1306 and isolation circuit 1301. Compare circuit 1406 is one embodiment of compare circuit $1306_{n-1,0}$, and isolation circuit 1401 is one embodiment of isolation circuit $1304_{n-1,0}$. Compare circuit 1403 includes inverter 1414, transistors 1406 and 1408 connected in series between priority signal line $1308_{n-1}$ and ground, and transistors 1410 and 1412 connected in series between match line segment $1310_{n-2,0}$ and ground. N-channel transistor 1406 has its drain coupled to signal line $1308_{n-1}$, it gate coupled to match line segment $1310_{n-1,0}$, and its source coupled to the drain of n-channel transistor 1408. Transistor 1408 has its gate coupled to receive the logical complement of the priority number bit (/D) stored in memory element $1302_{n-1,0}$, and its source coupled to ground. N-channel transistor 1410 has its drain coupled to match line segment $1310_{n-2,0}$, its gate coupled to signal line $1308_{n-1}$ via inverter 1414, and its source coupled to the drain of n-channel transistor 1412. Transistor 1412 has its gate coupled to receive the priority number bit (D) stored in memory element $1302_{n-1,0}$, and its source coupled to ground. Any of transistors 1406, 1408, 1410, and 1412 can be replaced with other types of transistors and the logic adjusted accordingly.

Isolation circuit 1401 includes inverters 1402 and 1404. For alternative embodiments, only one inverter may be used and the logic of the next compare circuit adjusted accordingly. For other embodiments, other isolation circuits such as one or more AND, OR, or XOR logic gates or pass gates may be used.

Using the structures and methods discussed above, compare operations may be performed in different blocks and different device indices may be concurrently generated by multiple index generators for one or more of the block compare operations. A search code corresponding to the compare operation is compared with block class codes to enable one or more relevant blocks to perform a compare operation, as previously discussed.

Where different CAM blocks are performing portions of one compare operation (i.e., the different CAM blocks are assigned the same class code), the results from each of the blocks participating in the compare operation may be combined to provide the address of the highest matching entry among all of the participating CAM blocks as the device index for the compare operation.

Figure 9:
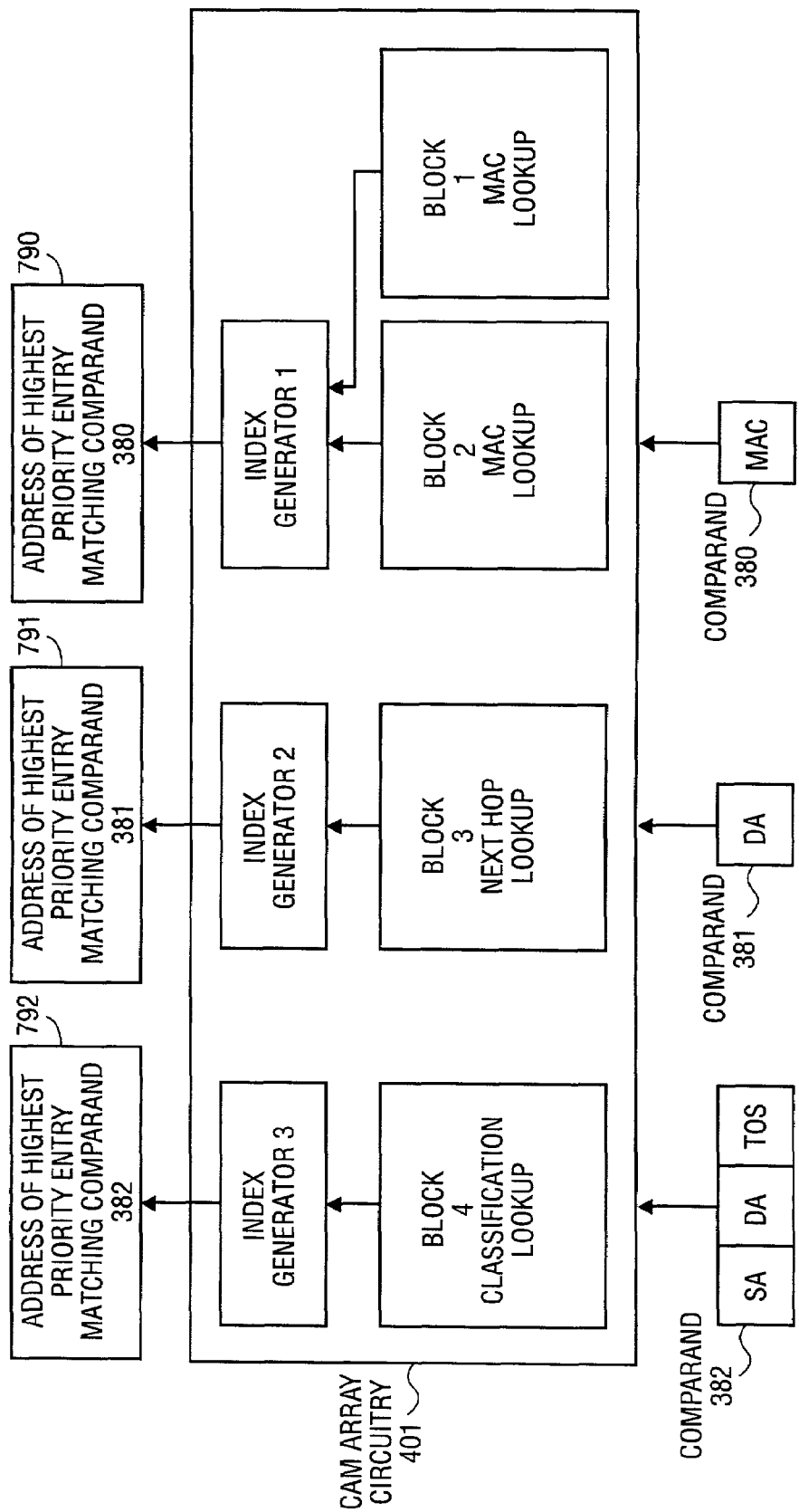
FIG. 9 illustrates a CAM device having multiple blocks that are coupled to corresponding index generators.

For example, CAM block 402(1) and CAM block 402(2) may be participating in a compare operation if their assigned class codes match the search code. If there is a first match condition in the CAM block 402(1) and a second match condition in CAM block 402(2), priority encoder 680 outputs the block identifier of the matching entry having the highest priority among the first and second matching conditions, where it is concatenated with its corresponding block identifier (e.g., 2 bits for four CAM blocks) from select circuit 670 to generate the device index (e.g., 14 bit) associated with the highest priority matching CAM block.

Where different CAM blocks are performing different compare operations, the index generators 415(1)–415(m) may concurrently output the results from each of the CAM block compare operations. The results from each of the index generators 415(1)–415(m) are provided as the address of the highest matching entry for a corresponding CAM block 402(1)–402(n), as illustrated in FIG. 9.

With reference again to the example discussed in relation to FIG. 3C, comparand 380 may be generated for compare operations in CAM blocks 1 and 2 and comparands 381 and 382 may be generated for compare operations in CAM blocks 3 and 4, respectively. CAM blocks 1 and 2 are coupled to index generator 1 and blocks 3 and 4 are coupled to index generators 2 and 3 respectively. Index generator 1 provides the address (index) 790 of the highest priority matching entry for the lookup performed with comparand 380 in blocks 1 and 2. Index generator 2 provides the address (index) 791 of the highest priority matching entry for the lookup performed with comparand 381 in block 3. Index generator 3 provides the address (index) 792 of the highest priority matching entry for the lookup performed with comparand 382 in block 4. Index generators 1, 2 and 3 may concurrently generate their respective indices 790, 791, and 792. Indices 790, 791, and 792 may then be provided to processor 310 to complete three separate routing operations. Indices 790, 791, and 792 may be concurrently provided to processor 310 or, alternatively, time-multiplexed.

It should be noted that the circuitry associated with the operations of a particular "diagram block" as illustrated within a "diagram block" (e.g., the match enable circuits 691 within index generator 415 and the array 504 within block 402) is done only for ease of discussion and that such circuitry may have other groupings or physical locations within device 420. In some embodiments, the block arrays may share similar circuitry.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative sense rather than a restrictive sense.

What is claimed is:

1. A content addressable memory (CAM) device, comprising:
   a plurality of CAM blocks each having a corresponding first priority encoder; and a plurality of index generators, each coupled to the plurality of CAM blocks, each of the plurality of index generators being configured to receive a respective outputs at least in part from the first priority encoder within each of the plurality of CAM blocks and wherein each of the plurality of index generators comprises a second priority encoder.

2. The CAM device of claim 1, wherein the output comprises a block index and a block match flag.

3. The CAM device of claim 1, wherein each of the plurality of CAM blocks is configured to concurrently transmit the output to the plurality of index generators.

4. The CAM device of claim 2, further comprising at least one filter circuit coupled with the plurality of CAM blocks.

5. The CAM device of claim 4, wherein each of the plurality of index generators further comprises a select circuit configured to receive the block index of the corresponding CAM block.

6. The CAM device of claim 5, wherein the select circuit comprises a multiplexer.

7. The CAM device of claim 5, wherein each of the plurality of CAM blocks is configured to concurrently transmit the corresponding block index and block match flag to the plurality of index generators.

8. The CAM device of claim 6, wherein each of the plurality of CAM blocks is configured to concurrently transmit the corresponding block index and block match flag to the plurality of index generators.

9. The CAM device of claim 2, wherein each of the plurality of index generators is configured to generate a device index using the block index and the block match flag of the plurality of CAM blocks.

10. The CAM device of claim 9, further comprising a selection circuit coupled to the plurality of index generators to select from among the device indices of the plurality of index generators.

11. The CAM device of claim 2, wherein each of the CAM blocks comprises:
    a CAM block array; the first priority encoder being coupled to the CAM block array to generate the block index;
    a block match flag circuit coupled to the CAM block array to generate the block match flag; and
    a block select circuit coupled enable the CAM block array.

12. The CAM device of claim 1, wherein each of the index generators further comprises a plurality of match enable circuits coupled to receive a block match flag from each of the CAM blocks and output qualified block match flags to the second priority encoder.

13. The CAM device of claim 11, wherein the block select circuit comprises:
    a memory storage element to store a class code; and
    a comparator coupled to the memory storage element to receive the class code and to receive a search code, the comparator to compare the search code with the class code and, in response, selectively enable the CAM block array to participate in the compare operation based on a result of the comparison.

14. The CAM device of claim 1, wherein each of the CAM blocks comprises a CAM block array; and wherein the first priority encoder comprises a programmable priority encoder coupled to the CAM block array.

15. The CAM device of claim 1, wherein each of the plurality of CAM blocks is configured to concurrently transmit the corresponding block index and block match flag to the plurality of index generators.

16. The CAM device of claim 1, further comprising a plurality of device flag logic circuits, each of the plurality of device logic circuits coupled to receive a search code corresponding to one of the plurality of index generators.

17. The CAM device of claim 16, wherein each of the index generators further comprises a plurality of match enable circuits coupled to receive a block match flag from each of the plurality of CAM blocks and output qualified block match flags to the second priority encoder.

18. The CAM device of claim 17, wherein each of the plurality of index generators further comprises a select circuit configured to receive the block index of each of the plurality of CAM blocks.

19. The CAM device of claim 1, wherein one of the plurality of index generators is configured to generate a device index using the block index and the block match flag of the plurality of CAM blocks.

20. The CAM device of claim 19, further comprising a selection circuit coupled to the plurality of index generators to select from among the device indices of the plurality of index generators.

21. The CAM device of claim 1, wherein each of the CAM blocks comprises:
  a CAM block array;
  a block priority encoder coupled to the CAM block array to generate the block index;
  a block match flag circuit coupled to the CAM block array to generate the block match flag; and
  a block select circuit coupled to the block match flag circuit.

22. The CAM device of claim 21, wherein each of the index generators further comprises a plurality of match enable circuits coupled to receive a block match flag from each of the plurality of CAM blocks and output qualified block match flags to the second priority encoder.

23. The CAM device of claim 21, wherein the block select circuit comprises:
  a memory storage element to store a class code; and
  a comparator coupled to the memory storage element to receive the class code and to receive a search code, the comparator to compare the search code with the class code and, in response, selectively enable the CAM block array to participate in the compare operation based on a result of the comparison.

24. The CAM device of claim 1, further comprising a processor coupled to receive the device index of at least one of the plurality of index generators.

25. The CAM device of claim 19, further comprising a processor coupled to receive the device index of at least one of the plurality of index generators.

26. The CAM device of claim 11, wherein each of the plurality of CAM blocks is configured to concurrently transmit the output to the plurality of index generators.

27. A method, comprising:
  concurrently performing compare operations in content addressable memory (CAM) block arrays of a CAM device, each of the CAM block arrays having an associated class code to match a corresponding one of a plurality of different search codes; and
  generating a plurality of device indices concurrently, each of the plurality of device indices corresponding to a particular class code.

28. The method of claim 27, further comprising receiving the plurality of different search codes.

29. The method of claim 27, wherein the device indices are the next free addresses associated with particular search codes.

30. The method of claim 27, further comprising concurrently generating a plurality of device flags corresponding to the determined matches between a class code of the CAM block arrays and the search codes.

31. The method of claim 27, further comprising programming a priority for each of a plurality of data groups stored in the CAM block arrays.

32. A method, comprising:
  performing a plurality of compare operations concurrently in a plurality of content addressable memory (CAM) blocks to generate a plurality of block indices; and
  generating a plurality of device indices concurrently within a respective plurality of index generators based, at least in part, on the plurality of block indices, each of the plurality of device indices corresponding to one of a plurality of class codes.

33. The method of claim 32, wherein generating the plurality of device indices further comprises generating the plurality of device indices concurrently.

34. The method of claim 33, further comprising selecting one of the plurality of device indices.

35. The method of claim 32, further comprising generating a plurality of device flags, each of the plurality of device flags corresponding to one of the plurality of class codes.

36. The method of claim 32, further comprising receiving a plurality of different search codes, wherein each of the CAM blocks comprises a CAM block array having associated therewith one of the plurality of class codes.

37. The method of claim 32, wherein performing a plurality of compare operations comprises:
  receiving a plurality of different search codes associated with a particular compare operation;
  comparing the plurality of different search codes with a class code associated with each of the plurality of CAM blocks; and
  performing compare operations in CAM blocks having associated class codes matching the received search code.

38. The method of claim 32, wherein the device indices are the next free addresses associated with particular search codes.

39. A content addressable memory (CAM) device, comprising:
  means for performing a plurality of compare operations concurrently in a plurality of CAM blocks to generate a plurality of block indices; and
  means for generating a plurality of device indices concurrently based, at least in part, on the plurality of block indices, each of the plurality of device indices corresponding to one of a plurality of class codes.

40. The CAM device of claim 39, further comprising means for concurrently generating the plurality of device indices.

41. The CAM device of claim 40, further comprising:
  means for receiving a plurality of different search codes associated with a particular compare operation;
  means for comparing the plurality of different search codes with a class code associated with each of the plurality of CAM blocks; and
  means for performing compare operations in CAM blocks having associated class codes matching the received search code.

42. The CAM device of claim 39, further comprising means for programming a priority for each of a plurality of data groups stored in CAM block arrays in the plurality of CAM blocks.

43. A content addressable memory (CAM) device, comprising:
- a plurality of CAM blocks each including a first priority encoder;
- a plurality of index generators, each coupled to receive a respective block index from the first priority encoder within each of the plurality of CAM blocks; and
- a plurality of flag logic circuits, each of the plurality of flag logic circuits coupled to a corresponding one of the plurality of index generators.

44. The CAM device of claim 43, wherein each of the plurality of index generators further comprises:
- a second priority encoder; and
- a plurality of match enable circuits coupled to receive a block match flag of the corresponding CAM block and output qualified block match flags to the second priority encoder and the corresponding flag logic circuit.

45. The CAM device of claim 43, wherein the second priority encoder is a programmable priority encoder.

\* \* \* \* \*

UNITED STATES PATENT AND TRADEMARK OFFICE
CERTIFICATE OF CORRECTION

PATENT NO.         : 7,114,026 B1
APPLICATION NO. : 10/174325
DATED                 : September 26, 2006
INVENTOR(S)       : Sandeep Khanna It is certified that error appears in the above-identified patent and that said Letters Patent is hereby corrected as shown below:

Claim 1, column 19, line 66, replace "respective outputs at" with --respective output at--
Claim 11, column 20, line 34, replace "block array; the" with --block array, the--
Claim 14, column 20, line 55, replace "block array; and" with --block array, and--
Claim 45, column 24, line 8, replace "device of claim 43" with --device of claim 44--

Signed and Sealed this

Twenty-sixth Day of December, 2006

JON W. DUDAS
*Director of the United States Patent and Trademark Office*